United States Patent
Kando

(10) Patent No.: US 7,486,001 B2
(45) Date of Patent: Feb. 3, 2009

(54) BOUNDARY ACOUSTIC WAVE DEVICE

(75) Inventor: Hajime Kando, Kyoto-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 343 days.

(21) Appl. No.: 10/560,275

(22) PCT Filed: Jan. 5, 2005

(86) PCT No.: PCT/JP2005/000037

§ 371 (c)(1),
(2), (4) Date: Dec. 8, 2005

(87) PCT Pub. No.: WO2005/069486

PCT Pub. Date: Jul. 28, 2005

(65) Prior Publication Data

US 2006/0138902 A1    Jun. 29, 2006

(30) Foreign Application Priority Data

Jan. 19, 2004    (JP)    ............................ 2004-010661
Sep. 7, 2004    (JP)    ............................ 2004-259399

(51) Int. Cl.
*H03H 9/00*    (2006.01)
*H01L 41/04*    (2006.01)
(52) U.S. Cl. .................... 310/313 R; 333/195
(58) Field of Classification Search ............... 310/313; 333/189–195
See application file for complete search history.

(56) References Cited

U.S. PATENT DOCUMENTS

| 4,625,184 | A |   | 11/1986 | Niitsuma et al. |
| 5,432,392 | A | * | 7/1995 | Kadota et al. ........... 310/313 A |
| 5,939,817 | A |   | 8/1999 | Takado |
| 6,437,479 | B1 |   | 8/2002 | Miura et al. |
| 6,737,941 | B1 |   | 5/2004 | Tournois |
| 7,310,027 | B2 | * | 12/2007 | Kando ........................ 333/133 |
| 7,322,093 | B2 | * | 1/2008 | Kadota et al. ................. 29/594 |
| 2002/0100964 | A1 |   | 8/2002 | Onishi et al. |
| 2006/0175928 | A1 | * | 8/2006 | Kando ........................ 310/311 |
| 2008/0074212 | A1 | * | 3/2008 | Matsuda et al. ............. 333/195 |

FOREIGN PATENT DOCUMENTS

| EP | 1732214 A1 | * | 12/2006 |
| EP | 1879291 A1 | * | 1/2008 |
| JP | 59-6611 |   | 1/1984 |
| JP | 6-2823 U |   | 1/1994 |

(Continued)

OTHER PUBLICATIONS

International Search Report for PCT Application No. PCT/JP2005-000037. International filing date Jan. 5, 2005; mailed Apr. 26, 2005.

(Continued)

*Primary Examiner*—Jaydi SanMartin
(74) *Attorney, Agent, or Firm*—Keating & Bennett, LLP

(57) ABSTRACT

A boundary acoustic wave device using SH boundary acoustic waves includes a first medium layer, a second medium layer stacked on the first medium layer, and an electrode including an interdigital electrode and reflectors. A sound absorbing layer is provided on the surface of the first medium layer and/or the second medium layer opposite the interface therebetween.

25 Claims, 25 Drawing Sheets

FOREIGN PATENT DOCUMENTS

| | | |
|---|---|---|
| JP | 07-154185 | 6/1995 |
| JP | 08-265089 | 10/1996 |
| JP | 09-046156 | 2/1997 |
| JP | 09-248908 | 9/1997 |
| JP | 10-163789 | 6/1998 |
| JP | WO 98/52279 | 11/1998 |
| JP | 10-335974 | 12/1998 |
| JP | 2001-015649 | 1/2001 |
| JP | 2002-009584 | 1/2002 |
| JP | 2002-222899 | 8/2002 |
| JP | 2002-346345 | 12/2002 |
| JP | 2003-017980 | 1/2003 |
| JP | 2003-512637 | 4/2003 |
| JP | 2003-338730 | 11/2003 |
| WO | WO 2005093949 A1 * | 10/2005 |
| WO | WO 2007097151 A1 * | 8/2007 |
| WO | WO 2007138840 A1 * | 12/2007 |

OTHER PUBLICATIONS

National Astronomical Observatory of Japan; Nov. 1996; pp. 484 and 485.

Official communication issued in the corresponding Korean Application No. 10-2005-7023309, mailed on Dec. 6, 2006.

Yamanouchi et al.; "Piezoelectric Acoustic Boundary Waves Propagating Along the Interface Between $SiO_2$ and $LiTaO_3$"; IEEE Transactions on Sonics and Ultrasonics; vol. SU-25, No. 6, 1978, pp. 384-389.

Takashi et al.; "Highly Piezoelectric Boundary Waves propagating in $Si/SiO_2/LiNbO_3$ Structure"; 26$^{th}$ EM Symposium; May 1997, pp. 53-58.

Campbell et al.; "A Method for Estimating Optimal Crystal Cuts and Propagattion Directions for Excitation of Piezoelectric Surface Waves"; IEEE Transactions on Sonics and Ultrasonics; vol. SU-15, 1968, pp. 209-217.

Official communication issued in counterpart Chinese Application No. 20058000353.0, issued on May 30, 2008.

* cited by examiner

BOUNDARY ACOUSTIC WAVE DEVICE

BACKGROUND OF THE INVENTION

1. Field of the Invention

The present invention relates to boundary acoustic wave devices using SH (shear horizontal) boundary acoustic waves, and more specifically, the present invention relates to a boundary acoustic wave device having an electrode in the interface between a piezoelectric material and a dielectric material.

2. Description of the Related Art

Various types of surface acoustic wave devices have been used in RF and IF filters for cellular phones, VCO resonators, and VIF filters for televisions. Surface acoustic wave devices use surface acoustic waves, such as Rayleigh waves or first leaky waves propagating along the surface of a medium.

Since surface acoustic waves propagate along the surface of a medium, they are sensitive to the changes of the medium state. Accordingly, in order to protect the surface acoustic wave propagating surface of the medium, the surface acoustic wave element is enclosed in a package having a recess or hole formed in the region opposing the propagating surface. The use of the package having the recess or the hole inevitably increases the cost of the surface acoustic wave device. Also, since the size of the package is larger than the size of the surface acoustic wave element, the size of the surface acoustic wave device must be increased.

In addition to the surface acoustic waves, acoustic waves include boundary acoustic waves propagating along the interface between solids.

"Piezoelectric Acoustic Boundary Waves Propagating Along the Interface Between $SiO_2$ and $LiTaO_3$," IEEE Trans., Sonics and Ultrasonics, VOL. SU-25, No. 6, 1978 IEEE has disclosed a boundary acoustic wave device using such boundary acoustic waves. The structure of the known boundary acoustic wave device will now be described with reference to FIG. 32.

The boundary acoustic wave device 201 has the structure in which an electrode 204 is disposed between a first medium layer 202 and a second medium layer 203. In this instance, an alternating electric field is applied to the electrode 204 to excite boundary acoustic waves to propagate while their energy is concentrated on the interface between the medium layers 202 and 203 and its vicinity. This boundary acoustic wave device, in which an IDT is formed on a 126°-rotated Y-plate X-propagating $LiTaO_3$ substrate, has a $SiO_2$ film with a predetermined thickness arranged over the IDT and the $LiTaO_3$ substrate. In this document, SV+P boundary acoustic waves called Stoneley waves are propagated. Incidentally, this document has disclosed that when the $SiO_2$ film has a thickness of $1.0\lambda$ ($\lambda$ represents the wavelength of the boundary acoustic waves), the electromechanical coupling coefficient is 2%.

Boundary acoustic waves propagate with their energy concentrated on the interface between the solids, and the bottom surface of the $LiTaO_3$ substrate and the upper surface of the $SiO_2$ film hardly have any energy. The characteristics were not therefore varied by the change of the surface state of the substrate or the thin film. Thus, the package having the recess or hole is unnecessary, and the acoustic wave device can be thus downsized accordingly.

"Highly Piezoelectric Boundary Waves propagating in $Si/SiO_2/LiNbO_3$ Structure" (26th EM Symposium, May 1997, pp. 53-58 [in Japanese] has disclosed SH boundary waves propagating in a $[001]$-Si(110)/$SiO_2$/Y-cut X-propagating $LiNbO_3$ structure. This type of SH boundary waves feature an electromechanical coupling coefficient $K^2$ higher than that of the Stoneley waves. In the use of SH boundary waves as well as in the use of Stoneley waves, the package having the recess or hole is not necessary. In addition, since SH boundary waves are of SH-type fluctuation, it can be considered that the strips defining the IDT or reflectors have a higher reflection coefficient in comparison with the case using Stoneley waves. It is therefore expected that the use of SH boundary waves for, for example, a resonator or a resonator filter can facilitate the downsizing of the device and produce sharp characteristics.

A boundary acoustic wave device uses boundary acoustic waves propagating with their energy concentrated on the interface between a first and a second medium layer and its vicinity. In this instance, the ideal thickness of the first and the second medium layer is infinite. However, their and the second medium layer is infinite. However, their thicknesses in practice are finite.

Also, the boundary acoustic wave devices of the above-mentioned documents undesirably produce spurious responses in their resonance characteristics or filter characteristics. Hence, a boundary acoustic wave resonator including such a boundary acoustic wave device is liable to produce a plurality of considerable spurious responses in the frequency region higher than the resonant frequency. Also, a filter made of a plurality of known boundary acoustic wave resonators, for example, a ladder-shaped filter, produces a plurality of spurious responses in the frequency region higher than the pass band, thus degrading the out-of-band attenuation disadvantageously.

This will be further described with reference to FIGS. 33 to 36. An Au electrode was formed to have a thickness of $0.05\lambda$ on a 15° Y-cut X-propagating $LiNbO_3$ substrate acting as a first medium layer, and a $SiO_2$ film acting as a second medium layer was deposited to a thickness of $2\lambda$ by RF magnetron sputtering at a wafer heating temperature of 200° C. A boundary acoustic wave resonator was thus produced. The electrode 204 included an IDT 204A and reflectors 204B and 204C, as shown in FIG. 33. The impedance-frequency characteristics and the phase-frequency characteristics of the boundary acoustic wave resonator are shown in FIG. 34. As designated by the arrows A1 to A3 in FIG. 34, large spurious responses occurred in the higher region than the antiresonant frequency.

Also, a ladder-shaped circuit shown in FIG. 35 was produced using a plurality of boundary acoustic wave resonators prepared in the same manner as described above, and the frequency characteristics of a ladder-shaped filter thus produced were measured. FIG. 36 shows the results. In FIG. 35, parallel arm resonators P1 and P3 each included an IDT having 50.5 pairs of electrode fingers and an aperture length of $30\lambda$. Series arm resonators S1 and S2 are structured by connecting the same two boundary acoustic wave resonators as used for the parallel arm resonators P1 and P3 in series. Another parallel arm resonator P2 included an IDT having 100.5 pairs of electrode fingers and an aperture length of $30\lambda$. Each $\lambda$ of the IDTs and reflectors of the parallel arm resonators P1 to P3 was 3.0 µm, and $\lambda$ of the series arm resonators was set so that the antiresonant frequency of the parallel arm resonator P1 and the resonant frequency of the series arm resonators overlap with each other. The duty ratios of the IDT and the reflectors were each 0.58. The electrode was made of Au and had a thickness of $0.05\lambda$, and the $SiO_2$ film had a thickness of $2.5\lambda$.

FIG. 36 clearly shows that a plurality of large spurious responses indicated by arrows B1 to B3 occur in a region higher than the pass band.

SUMMARY OF THE INVENTION

In order to overcome the problems described above, preferred embodiments of the present invention provide a boundary acoustic wave device that prevents a plurality of spurious responses in the region higher than the resonant frequency or the pass band and exhibits superior frequency characteristics.

Preferred embodiments of the present invention are directed to a boundary acoustic wave device using boundary acoustic waves propagating along the interface between a first medium layer and a second medium layer. The boundary acoustic wave device includes the first medium layer, the second medium layer stacked on the first medium layer, an electrode disposed in the interface between the first medium layer and the second medium layer, and a sound absorbing layer for attenuating modes producing spurious responses, disposed on one or both of the surfaces of the first and second medium layers opposite the interface.

The acoustic velocity of the transverse waves in the sound absorbing layer may be lower than the acoustic velocity of the transverse waves in the first medium layer and/or second medium layer that has the sound absorbing layer.

The acoustic velocity of the longitudinal waves in the sound absorbing layer may be lower than the acoustic velocity of the longitudinal waves in the first medium layer and/or second medium layer that has the sound absorbing layer.

Preferably, the acoustic velocity of the transverse waves in the sound absorbing layer is in the range of about 0.13 to about 1.23 times the acoustic velocity of the transverse waves in the first medium layer and/or second medium layer that has the sound absorbing layer.

More preferably, the acoustic impedance of the sound absorbing layer is in the range of about 0.20 to about 5.30 times the acoustic impedance of the first medium layer and/or second medium layer that has the sound absorbing layer.

The sound absorbing layer may be made of the same type of material as the first medium layer and/or the second medium layer.

The boundary acoustic wave device may further include a low attenuation constant layer outside the sound absorbing layer. The attenuation constant layer has a lower attenuation constant for acoustic waves than the sound absorbing layer.

The sound absorbing layer may be made of at least one material selected from the group consisting of resin, glass, ceramic, and metal.

The sound absorbing layer may be made of a resin containing a filler.

The sound absorbing layer may be disposed on the surface of the first medium layer and/or the second medium layer so as to oppose a boundary acoustic wave propagation path in the interface.

The boundary acoustic wave device may further include an electrically conductive layer on at least one surface of the sound absorbing layer.

The boundary acoustic wave device may further include a through-hole electrode passing through the first medium layer and/or the second medium layer. The through-hole electrode is electrically connected to the electrode disposed at the interface. An external electrode is also disposed on an external surface of the boundary acoustic wave device and is connected to the through-hole electrode.

Preferably, the through-hole electrode is filled with an elastic material.

The through-hole electrode may be provided separately in the first medium layer and the second medium layer, and the through-hole electrode of the first medium layer and the through-hole electrode of the second medium layer are formed in a discontinuous manner.

The boundary acoustic wave device may further include a wiring electrode provided on an external surface of the boundary acoustic wave device and electrically connected to the electrode disposed at the interface.

The boundary acoustic wave device may further include a connection electrode connected to the electrode disposed at the interface, and the boundary acoustic wave device has steps on a side surface intersecting the interface. The connection electrode is extended to the steps, and the wiring electrode is extended to the steps and connected to the connection electrode at the steps.

The boundary acoustic wave device may further include a third material layer in at least one of regions between the first medium layer and the second medium layer, on the outer surface of the first medium layer, and on the outer surface of the second medium layer. The third material layer has a lower linear expansion coefficient in the direction parallel to the interface than the first and the second medium layer. The "outer surface" of the medium layer used herein refers to the surface opposite the interface.

Alternatively, the boundary acoustic wave device may include a third material layer in at least one of the regions between the first medium layer and the second medium layer, on the outer surface of the first medium layer, and on the outer surface of the second medium layer, and the third material layer has a linear expansion coefficient in the direction parallel to the interface, with the opposite sign to that of the first and the second medium layer.

The boundary acoustic wave device may further include a fourth material layer in at least one of regions between the first medium layer and the second medium layer, on the outer surface of the first medium layer, and on the outer surface of the second medium layer. The fourth material layer has a higher thermal conductivity than the first and the second medium layers.

The boundary acoustic wave device may further include an impedance matching circuit in the interface or on the outer surface of the first or the second medium layer.

The second medium layer may have a thickness of about $0.5\lambda$ or more and the sound absorbing layer may have a thickness of about $1.0\lambda$ or more.

Preferably, a sound absorbing layer of the boundary acoustic wave device according to a preferred embodiment of the present invention has a multilayer structure.

The sound absorbing layer may have a multilayer structure including a plurality of sound absorbing material layers. A sound absorbing material layer close to the second medium layer has an acoustic characteristic impedance between the acoustic impedances of the second medium layer and a sound absorbing material layer farther from the second medium layer.

The boundary acoustic wave device may further include a mounting board bonded to a mounting surface with a bump, made of a material harder than the structure including the first and second medium layers and the sound absorbing layer. The boundary acoustic wave device is mounted using the mounting board.

The boundary acoustic wave device may further include a stress absorber on a surface of the mounting side.

Preferred embodiments of the present invention are also directed to a method for manufacturing a boundary acoustic wave device. The method includes the steps of forming an electrode on a first medium layer, forming a second medium layer so as to cover the electrode, and forming a sound absorbing layer on one or both of the surfaces of the first medium layer and/or the second medium layer opposite the interface therebetween.

The step of forming the sound absorbing layer may include the step of removing the gas contained in the sound absorbing layer.

The method may be performed in a mother state in which a plurality of boundary acoustic wave devices are continuously connected and not yet divided into individual boundary acoustic wave devices, and the mother state is divided into boundary acoustic wave devices after the sound absorbing layer is formed.

Alternatively, the steps before the step of forming the sound absorbing layer may be performed in a mother state, and the step of forming the sound absorbing layer is performed after the mother state is divided into boundary acoustic wave devices.

In the boundary acoustic wave device of preferred embodiments of the present invention, the electrode is disposed in the interface between the first medium layer and the second medium layer, and a sound absorbing layer for attenuating modes producing spurious responses is further provided on the outer surface of the first and/or the second medium layer opposite to the interface. The sound absorbing layer prevents a plurality of spurious responses in a higher region than the resonant frequency or the pass band effectively, as shown in the experiments described below. Consequently, the resulting boundary acoustic wave device can exhibit superior resonance characteristics or filter characteristics.

If the acoustic velocity of the transverse waves in the sound absorbing layer is lower than that of the transverse waves in the first and/or second medium layer having the sound absorbing layer, undesired spurious responses of the transverse waves can be reduced effectively.

If the acoustic velocity of the longitudinal waves in the sound absorbing layer is lower than that of the longitudinal waves in the first and/or second medium layer having the sound absorbing layer, undesired spurious responses of the longitudinal waves can be reduced effectively.

In particular, if the acoustic velocity of the transverse waves in the sound absorbing layer is in the range of about 0.13 to about 1.23 times the acoustic velocity of the transverse waves in the first and/or second medium layer having the sound absorbing layer, undesired spurious responses of the transverse waves can be reduced effectively.

If the acoustic impedance of the sound absorbing layer is in the range of about 0.2 to about 5.3 times the acoustic impedance of the first and/or second medium layer, a plurality of undesired spurious responses can be reduced effectively.

If the sound absorbing layer is made of the same type of material as the first and/or the second medium layer, the sound absorbing layer can be formed in a similar step of forming the first and/or the second medium layer.

If a low attenuation constant layer having a lower attenuation constant for the boundary acoustic waves than the sound absorbing layer is provided outside the sound absorbing layer, the moisture resistance can be enhanced because many of the films having a low attenuation constant are superior in compactness. Therefore, the sound absorbing layer and its underlying layers can be protected effectively.

The sound absorbing layer may be made of a variety of materials. A sound absorbing layer made of at least one material including resin, glass, ceramic, and metal can sufficiently absorb sound and is relatively hard. Accordingly, such a sound absorbing layer can reduce undesired spurious responses effectively and lead to a boundary acoustic wave device having a superior strength. The sound absorbing layer is not necessarily made of a single material. Many resin materials have high attenuation constants and they can provide sound absorbing media having various acoustic velocities or acoustic characteristic impedances by adding a filler of a ceramic or a metal, such as carbon, silica, and tungsten. For example, a resin material, such as epoxy resin, containing the filler not only facilitates the control of the acoustic velocity or the acoustic characteristic impedance, but also scatters acoustic waves to increase the attenuation constant.

If the sound absorbing layer is disposed on the surface of the first and/or the second medium layer so as to oppose the boundary acoustic wave propagation path in the interface, the sound absorbing layer can reduce undesired spurious responses effectively.

If an electrically conductive layer is provided on at least one surface of the sound absorbing layer, the electrically conductive layer can serve as an electromagnetic shield.

If the boundary acoustic wave device further includes a through-hole electrode passing through the first medium layer and/or the second medium layer, electrically connected to the electrode disposed at the interface, and an external electrode disposed on an external surface of the boundary acoustic wave device, connected to the through-hole electrode, the boundary acoustic wave device can be electrically connected using the through-hole electrode. Consequently, the size of the boundary acoustic wave device can be minimized.

A through-hole electrode filled with an elastic material without cavities can reduce the difference in acoustic impedance from the medium layers. Consequently, undesired reflection and scattering of the boundary acoustic waves can be prevented. Furthermore, the penetration of corrosive gases can be prevented.

If the through-hole electrode is provided separately in the first medium layer and the second medium layer and the through-hole electrodes of the first medium layer and the second medium layer do not overlap in the thickness direction, the penetration of corrosive gases can be prevented.

If a wiring electrode is further provided on an external surface of the boundary acoustic wave device and electrically connected to the electrode disposed at the interface, the electrode in the boundary acoustic wave device can be extended to the external surface.

If the boundary acoustic wave device has steps on a side surface intersecting the interface, and the wiring electrode on the external surface is connected to a connection electrode at the steps, the reliability of the electrical connection can be enhanced.

If a third material layer having a lower linear expansion coefficient in the direction parallel to the interface than the first and the second medium layer is provided in at least one of regions between the first medium layer and the second medium layer, on the outer surface of the first medium layer, and on the outer surface of the second medium layer, external deformation resulting from temperature changes, such as a warp, can be prevented. In addition, the temperature dependency of the frequency characteristics can be improved, such as the center frequency of a filter or the resonant frequency of a resonator.

If a third material layer having a linear expansion coefficient in the direction parallel to the interface, with the opposite sign to that of the first and the second medium layer is provided in at least one of regions between the first medium layer and the second medium layer, on the outer surface of the first medium layer, and on the outer surface of the second medium layer, external deformation resulting from temperature changes, such as a warp, can be further prevented. In addition, the temperature dependency of the frequency characteristics can be improved, such as the center frequency of a filter or the resonant frequency of a resonator.

If a fourth material layer having a higher thermal conductivity than the first and the second medium layer is provided in at least one of regions between the first medium layer and the second medium layer, on the outer surface of the first medium layer, and on the outer surface of the second medium layer, the boundary acoustic wave device can enhance the heat dissipation ability and prevent temperature increase when high power is applied. Thus, the electrical power resistance can be improved.

If an impedance matching circuit is provided in the interface or on the outer surface of the first or the second medium layer, the boundary acoustic wave device contains the impedance matching circuit.

If the second medium layer has a thickness of about 0.5λ or more and the sound absorbing layer has a thickness of about 1.0λ or more, undesired spurious responses can be reduced more effectively according to another preferred embodiment of the present invention.

If the sound absorbing layer has a multilayer structure, desired characteristics can be easily given to the sound absorbing multilayer by selecting the thickness and the material of each layer of the sound absorbing multilayer.

If the sound absorbing layer has a multilayer structure including a plurality of material layers and a sound absorbing material layer close to the second medium layer has an acoustic characteristic impedance between the acoustic impedances of the second medium layer and a sound absorbing material layer farther away from the second medium layer, the acoustic impedances of the second medium layer and the outer sound absorbing material layer can be highly matched.

If the boundary acoustic wave device has a mounting board bonded to the mounting surface with a bump and the mounting board is made of a material that is harder than the structure including the first and second medium layers and the sound absorbing layer, the boundary acoustic wave device can be easily mounted on a printed board or the like using the mounting board. Since the mounting board has a relatively high strength, stress from the printed board or the like can be prevented from being transmitted to the boundary acoustic wave chip side even if the mounting on the printed board is made by soldering. Consequently, even if the printed board is warped for example, the boundary acoustic wave device can be prevented from deteriorating in frequency characteristics, or from cracking.

If a stress absorber is provided between the boundary acoustic wave device and the mounting board, the stress absorber prevents stress caused by the warp or the like of the printed board, to which a mounting structure is to be fixed, from being transmitted to the boundary wave chip. Consequently, the boundary wave chip can be prevented from warping, deteriorating in frequency characteristics, and cracking.

The method for manufacturing a boundary acoustic wave device according to a preferred embodiment of the present invention includes the steps of forming an electrode on a first medium layer, forming a second medium layer so as to cover the electrode, and forming a sound absorbing layer on one or both of the surface of the first medium layer and/or the second medium layer opposite the interface therebetween, thus providing the boundary acoustic wave device according to another preferred embodiment of the present invention.

If the step of forming the sound absorbing layer includes the step of removing the gas contained in the sound absorbing layer, the changes of frequency characteristics with time can be reduced.

If in the manufacturing method of a preferred embodiment of the present invention, the steps up to the step of forming the sound absorbing layer are performed in a mother state in which a plurality of boundary acoustic wave devices are continuously connected and the mother state is divided into boundary acoustic wave devices after the sound absorbing layer is formed, the boundary acoustic wave device of another preferred embodiment of the present invention can be efficiently manufactured. Alternatively, if the steps before the step of forming the sound absorbing layer are performed in the mother state, and the step of forming the sound absorbing layer is performed after the mother state is divided into boundary acoustic wave devices, the sound absorbing layer can cover the entire chip except an external terminal, thereby enhancing the environmental resistance of the boundary wave device.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

The present invention will be further described in detail by way of specific preferred embodiments with reference to the drawings.

The present inventors conducted a numerical analysis to find the cause of the above-described spurious responses. This numerical analysis was based on the method disclosed in the literature "A Method For Estimating Optimal Cuts and Propagation Directions For Excitation and Propagation Directions For Excitation of Piezoelectric Surface Waves" (J. J. Campbell and W. R. Jones, IEEE Trans. Sonics and Ultrasonics, Vol. SU-15 (1968), pp. 209-217). In this analysis, the displacements and the vertical stress at the interfaces between $SiO_2$ and Au and between the Au and $LiNbO_3$ were continuous, and the potential was 0 by the short-circuited interfaces. The $SiO_2$ had a predetermined thickness and the thickness of the 15° Y—X propagating $LiNbO_3$ was unlimited. The displacement distribution of the boundary waves and spurious modes were thus examined.

Figure 2:
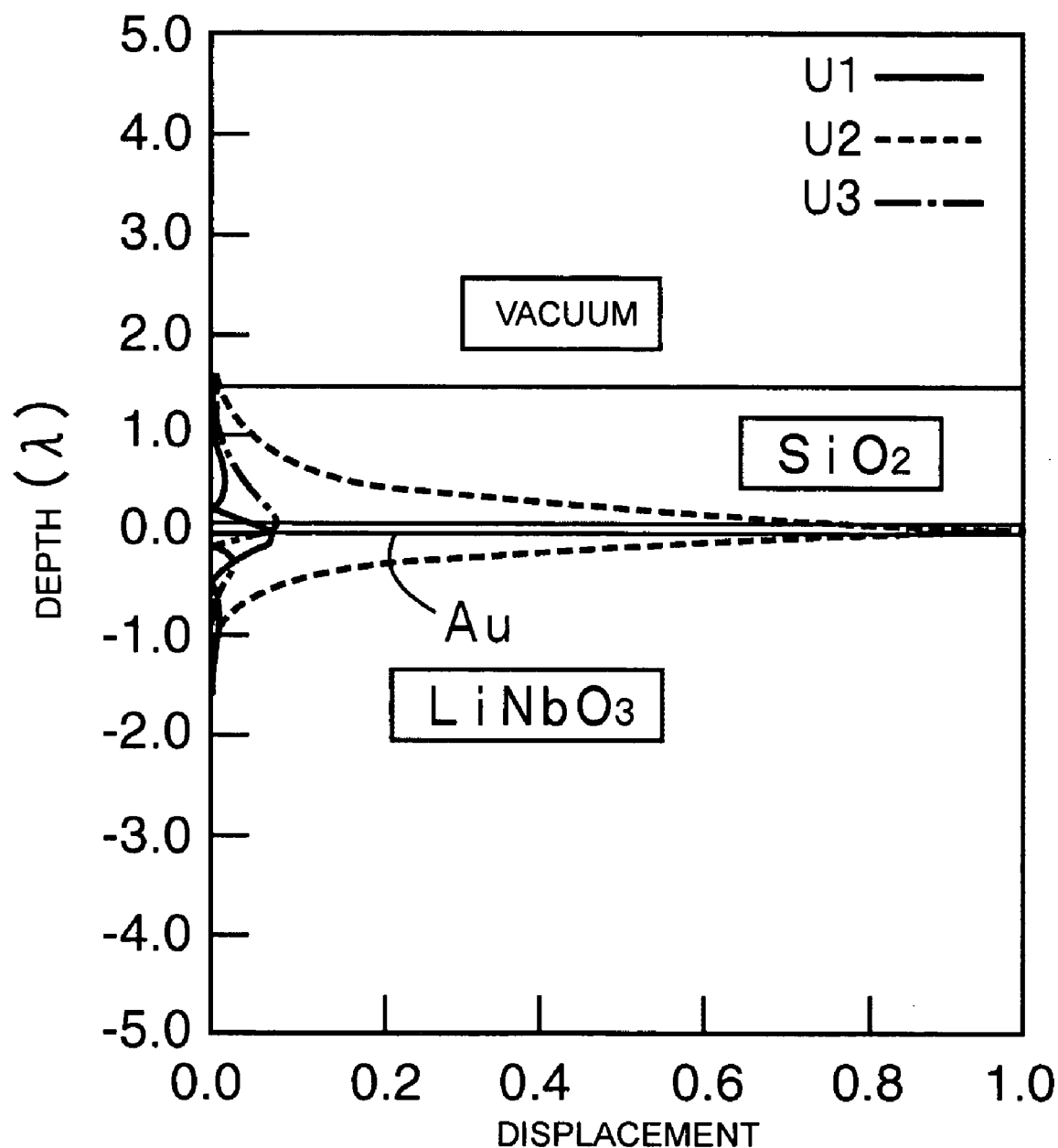
FIG. 2 is a graph of the displacement distribution of boundary acoustic waves in the main mode when a $SiO_2$/Au/$LiNbO_3$ structure has an Au thickness of about 0.05λ and a $SiO_2$ film thickness of about 1.5λ.
Figure 3A:
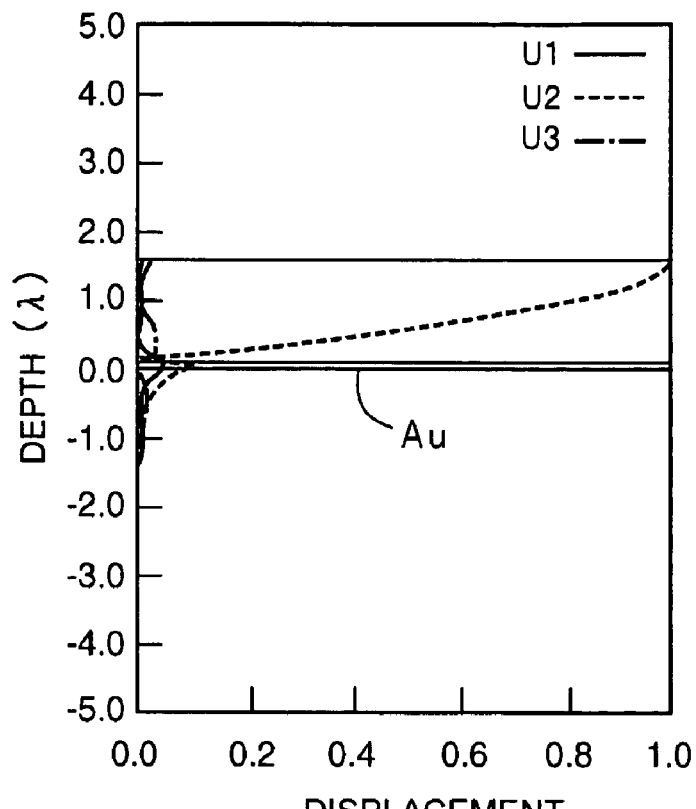
FIGS. 3A and 3B are graphs of displacement distributions in spurious modes under the same conditions as in FIG. 2.
Figure 3B:
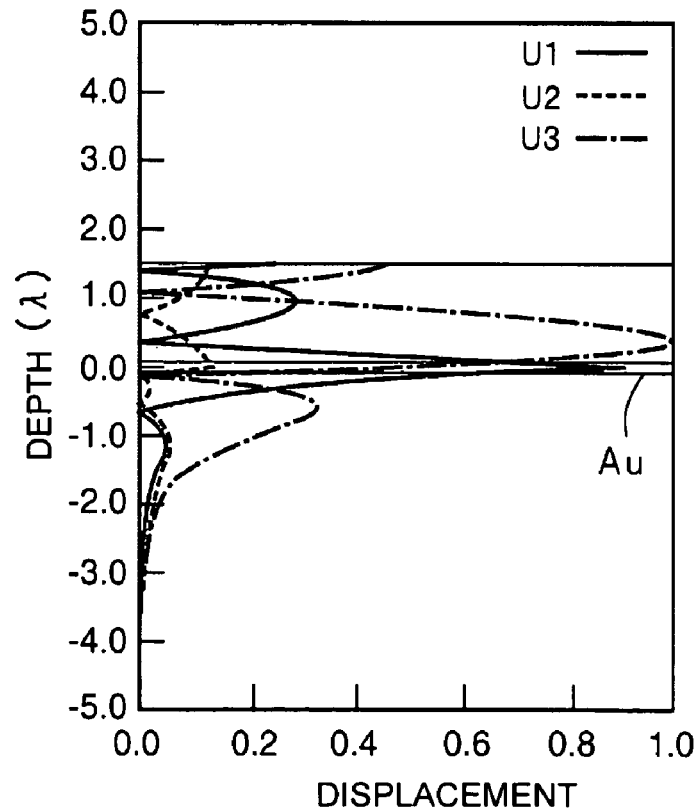
Figure 4A:
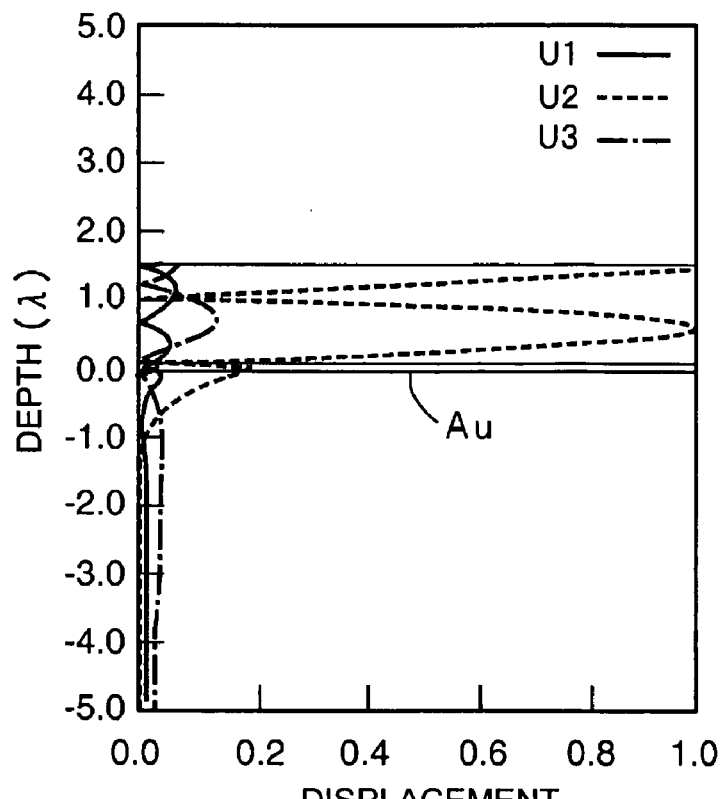
FIGS. 4A and 4B are graphs of displacement distributions in spurious modes under the same conditions as in FIG. 2.
Figure 4B:
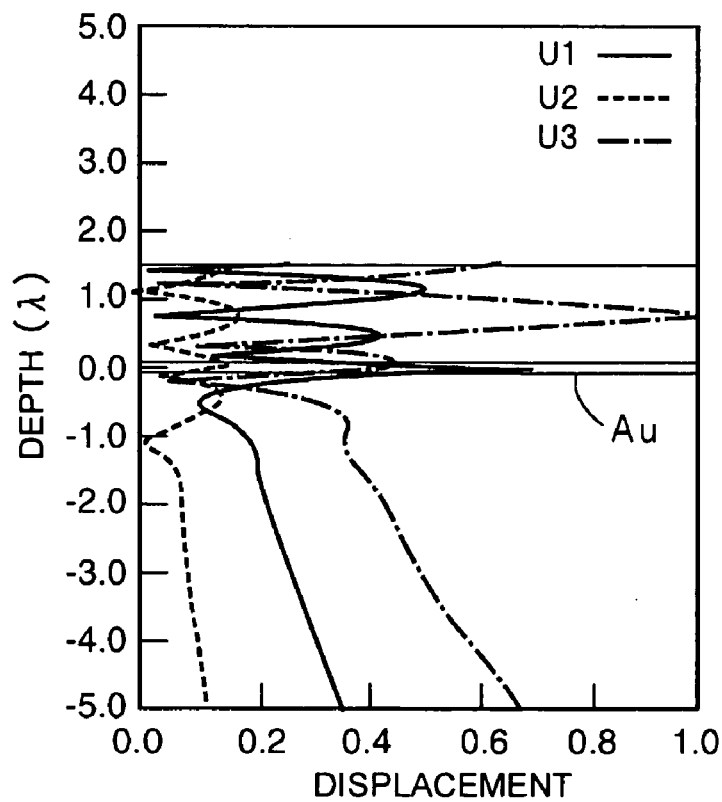
Figure 5A:
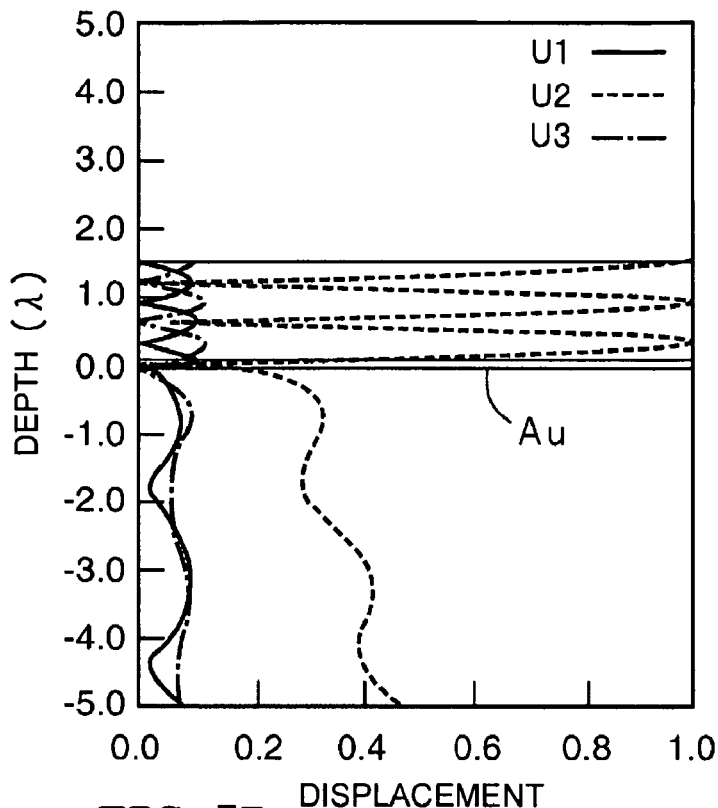
FIGS. 5A and 5B are graphs of displacement distributions in spurious modes under the same conditions as in FIG. 2.
Figure 5B:
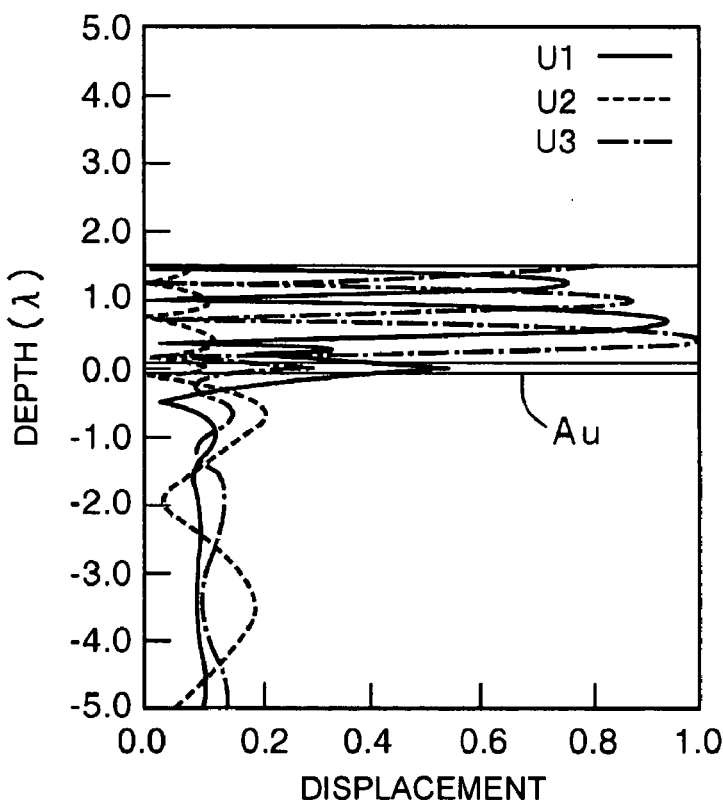
Figure 6A:
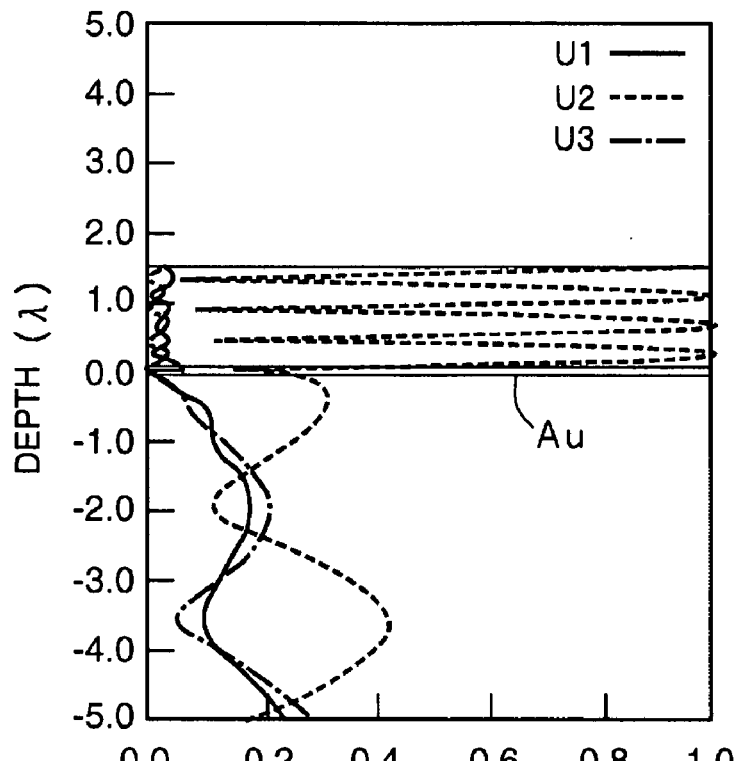
FIGS. 6A and 6B are graphs of displacement distributions in spurious modes under the same conditions as in FIG. 2.
Figure 6B:
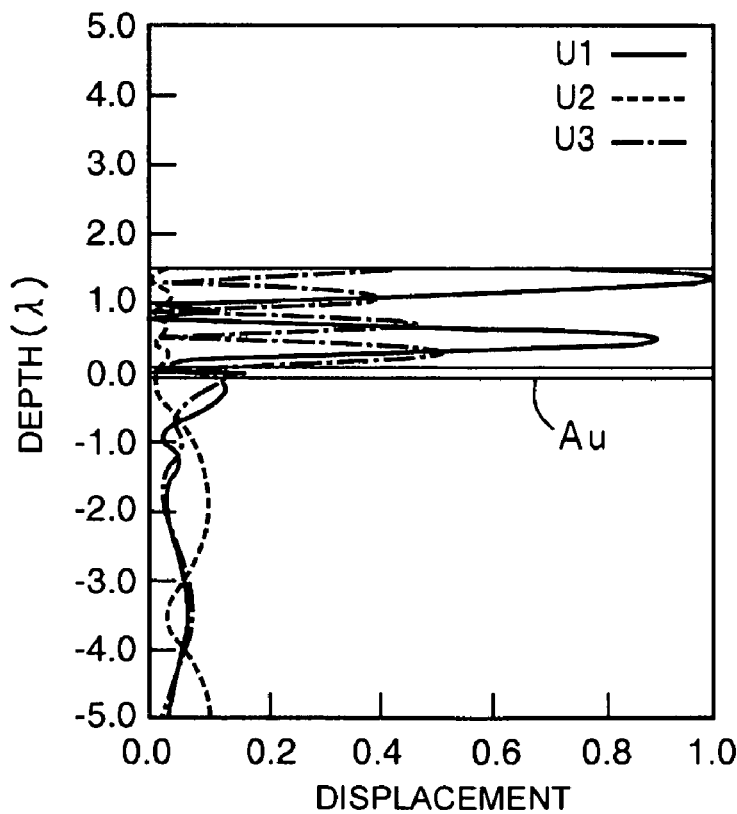
Figure 7:
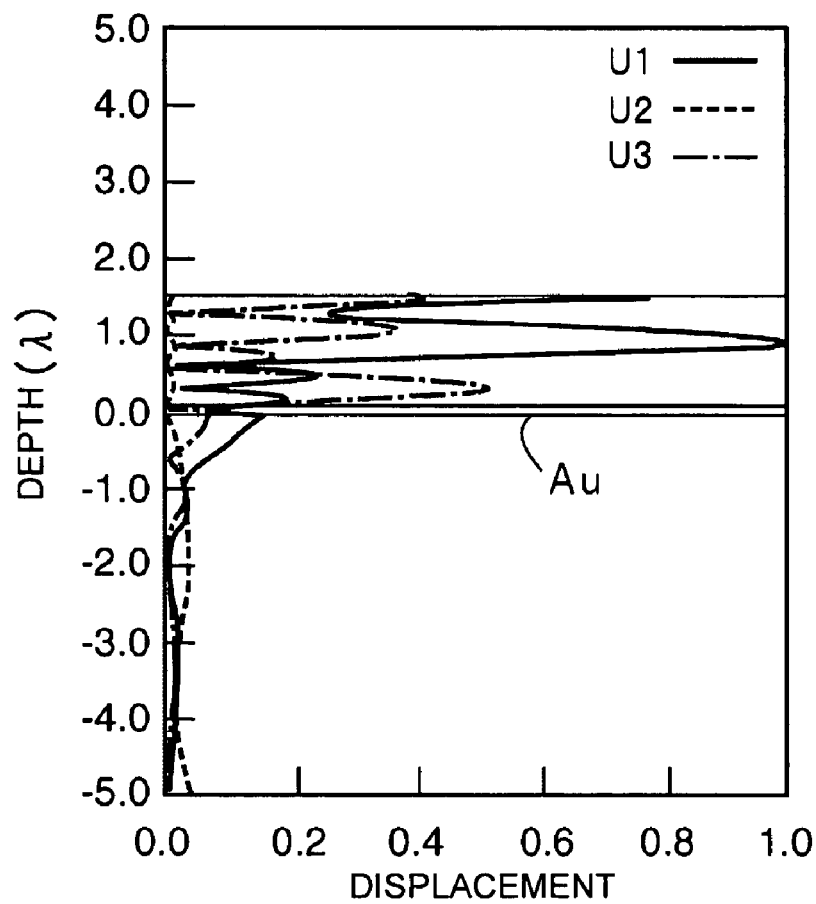
FIG. 7 is a graph of a displacement distribution in another spurious mode under the same conditions as in FIG. 2.

FIG. 2 shows the displacement distribution of boundary acoustic waves in the main mode when the Au thickness was $0.05\lambda$ and the $SiO_2$ thickness was $1.5\lambda$.

FIGS. 3A to 7 show displacement distributions of spurious modes under the same conditions as in FIG. 2. The displacement distribution in FIG. 2 and the displacement distributions of the spurious modes in FIGS. 3A to 7 are shown in ascending order of the response frequencies of their respective boundary waves and spurious modes. Specifically, the boundary waves of FIG. 2 have the lowest frequency and the spurious mode waves of FIG. 7 have the highest frequency. $\lambda$ represents the wavelength of the boundary waves in the main mode.

In FIGS. 2 to 7, the solid line represents component U1 (component along the $X_1$ direction in displacement), the broken line represents component U2 (component along the $X_2$ direction in the displacement), and the dotted-chain line represents component U3 (component along the $X_3$ direction in the displacement).

The $X_1$ direction refers to the direction in which boundary waves propagate at the interface; the $X_2$ direction refers to the direction perpendicular to the $X_1$ direction in the plane of the interface; the $X_3$ direction refers to the direction perpendicular to the interface.

In general, acoustic waves include p waves defined by U1, SH waves defined by component U2, and SV waves defined by component U3. The boundary acoustic waves and the spurious modes are each in a mode according to a combination of these partial waves, P, SH, and SV waves. In FIGS. 3B to 7, only the Au layer is shown and the $SiO_2$ layer and the $LiNbO_3$ layer are omitted in the figures for the sake of simplification.

FIG. 2 clearly shows that the primary component of the boundary waves, or the main mode, is the SH acoustic waves essentially composed of component U2.

Figure 36:
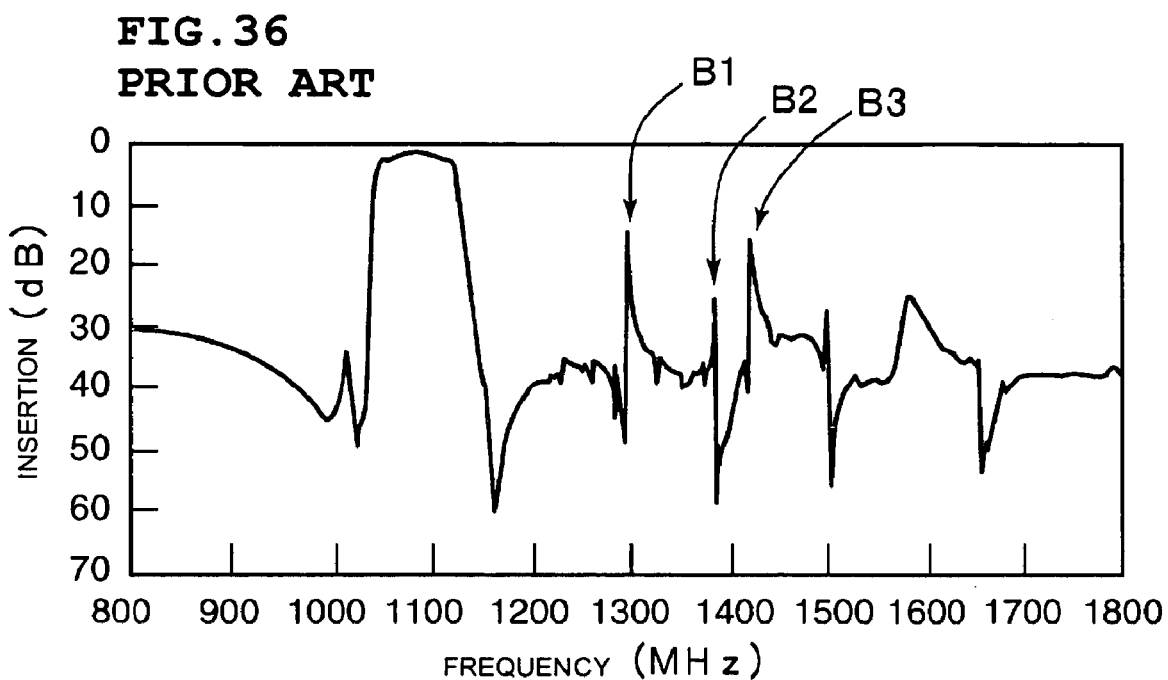
FIG. 36 is a graph showing the attenuation-frequency characteristics of a ladder-type filter constituted of a plurality of known boundary acoustic wave elements.

As is clear from FIGS. 3A to 7, spurious modes are roughly divided into three types: one essentially composed of component U2; another essentially composed of components U1 and U3; and the other essentially composed of component U1. Waves in these three types of spurious modes propagate with most of their energy confined between the surface of the SiO₂ second medium layer and the Au electrode provided in the interface. The occurrence of the three types of spurious modes produces the above-mentioned plurality of spurious responses shown in FIGS. 34 and 36.

In addition to the spurious modes shown in FIGS. 3A to 7, another mode similar to the Stoneley waves essentially composed of components U1 and U3 (hereinafter collectively referred to as Stoneley waves) propagates as well. However, the SiO₂/Au (0.05λ)/15° Y—X propagating LiNbO₃ structure has an electromechanical coupling coefficient of about 0 for the Stoneley waves, and accordingly does not excite Stoneley waves.

In consideration of the results shown in FIGS. 2 to 7, the present inventors thought that the above-mentioned plural spurious responses in the higher region can be reduced by controlling the modes in which waves propagate with their energy confined in the second medium layer, and consequently discovered and developed the present invention.

Figure 1A:
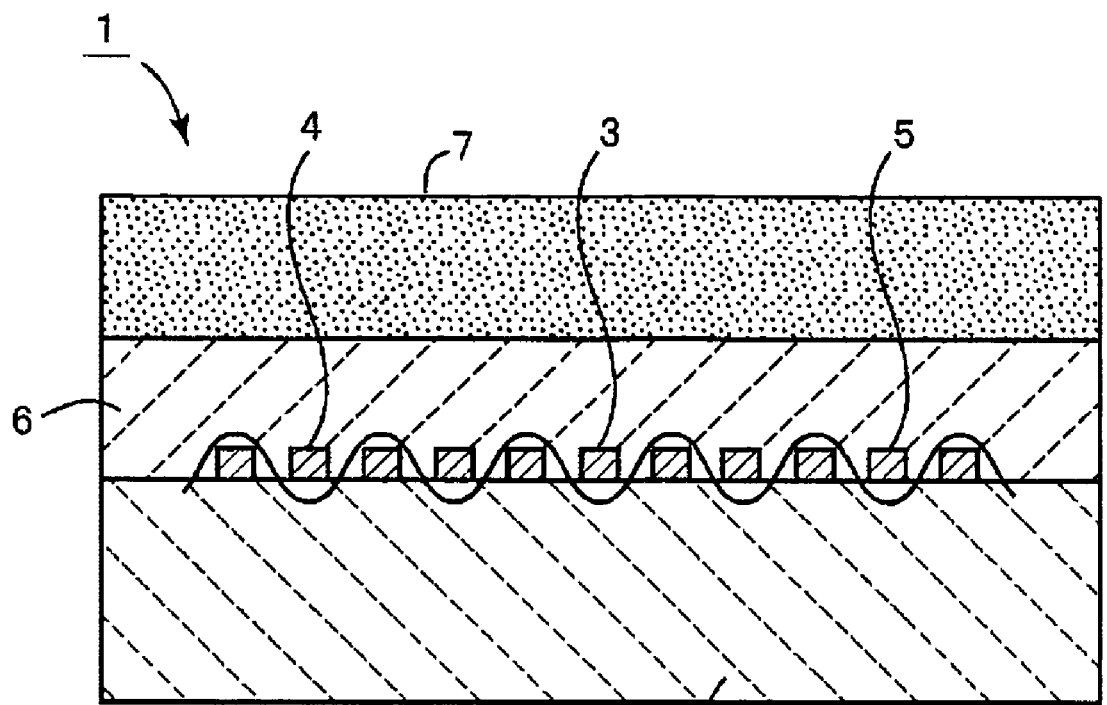
FIGS. 1A and 1B are a front sectional view and a schematic perspective view, respectively, of a boundary acoustic wave device according to a preferred embodiment of the present invention.
Figure 1B:
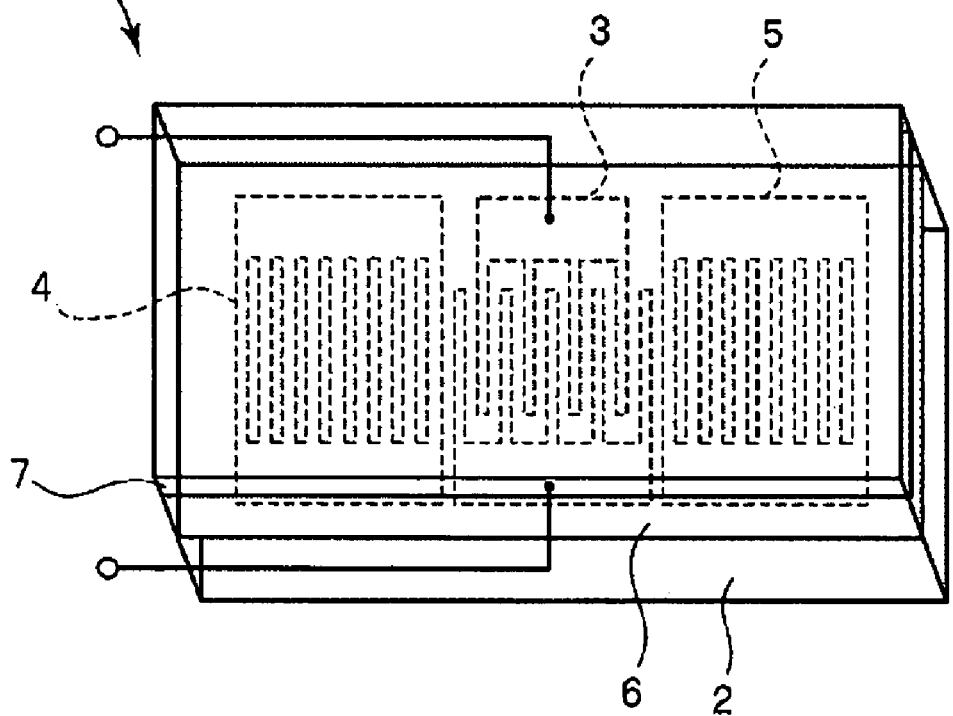

FIGS. 1A and 1B are a front sectional view and a schematic perspective view of a boundary acoustic wave device according to a first preferred embodiment of the present invention, respectively.

The boundary acoustic wave device 1 includes a first medium layer 2. The first medium layer 2 is preferably formed of a 15° Y—X propagating LiNbO₃ single crystal substrate. However, the first medium layer 2 may be made of any other single crystal substrate. For example, a LiNbO₃ piezoelectric single crystal substrate may be used or other piezoelectric single crystals, such as LiTaO₃, may be used.

An IDT 3 and reflectors 4 and 5 are provided on the upper surface of the first medium layer 2. In the present preferred embodiment, grating reflectors 4 and 5 are disposed at both sides of the IDT 3 to form a 1-port boundary acoustic wave element.

A second medium layer 6 is arranged to cover the IDT 3 and the reflectors 4 and 5. The second medium layer 6 is made of a SiO₂ film in the present preferred embodiment.

Further, a sound absorbing layer 7 is provided on the upper surface of the second medium layer 6. The sound absorbing layer 7 is made of a resin, for example, having an acoustic wave attenuation constant higher than that of the second medium layer 6. In the present preferred embodiment, the IDT 3 and the reflectors 4 and 5 are formed by depositing an Au main electrode layer to a thickness of about 0.05λ on a about 0.003λ thick NiCr contact layer. The IDT preferably has 50 pairs of electrode fingers having a duty ratio of about 0.55 with weighting by varying the finger overlap, and opposing bus bars at an interval of about 30.5λ, as in the boundary acoustic wave element that exhibited the characteristics shown in FIG. 34. The numbers of the electrode fingers of the reflectors 4 and 5 are preferably about 50. The intervals between the ends of the electrode fingers of the IDT are preferably about 0.25λ and the maximum finger overlap is preferably about 30λ. The IDT 3 and the reflectors 4 and 5 preferably have the same λ value, and the center distance between the electrode fingers of the IDT 3 and the reflectors 4 and 5 is preferably about 0.5λ. The SiO₂ film preferably has a thickness of about 2λ. Under these conditions, deposition is performed by RF magnetron sputtering at wafer heating temperature of about 200° C. in the same manner as in the example of the characteristic comparison shown in FIG. 34.

Hence, the boundary acoustic wave device 1 has the same structure as the above-described comparative example, except for having the sound absorbing layer 7.

The sound absorbing layer 7 is made of an epoxy resin having a controlled hardness and has a thickness of about 5λ or more. The sound absorbing layer 7 is formed by applying the epoxy resin onto the second medium layer 6 and curing the resin.

Figure 8:
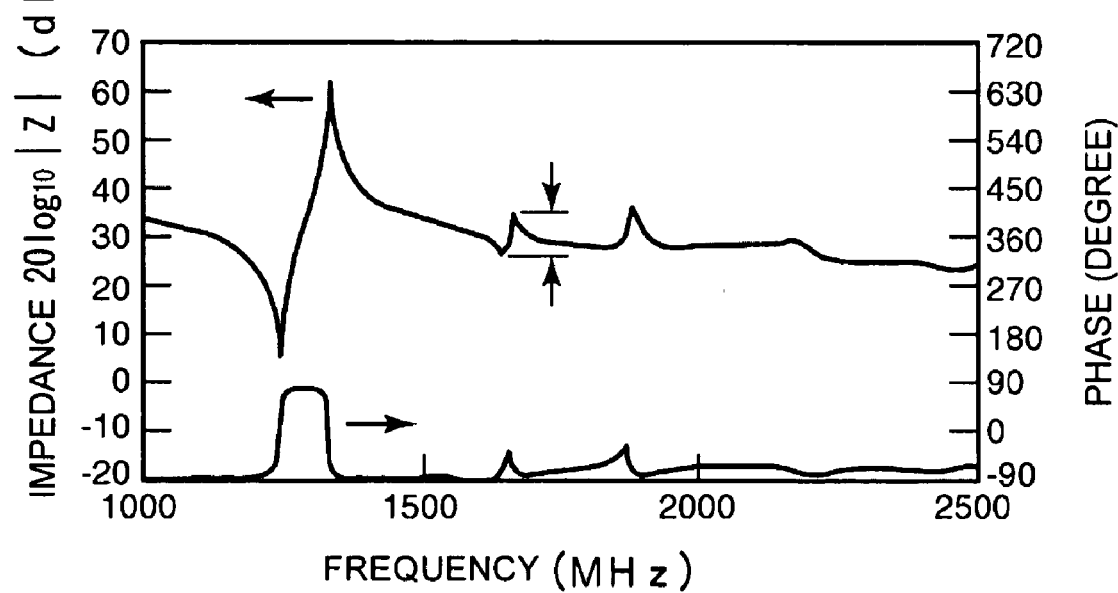
FIG. 8 is a graph of the impedance-frequency characteristics and the phase-frequency characteristics of the boundary acoustic wave device shown in FIG. 1.

FIG. 8 shows the impedance-frequency characteristics and the phase-frequency characteristics of the boundary acoustic wave device 1.

Figure 34:
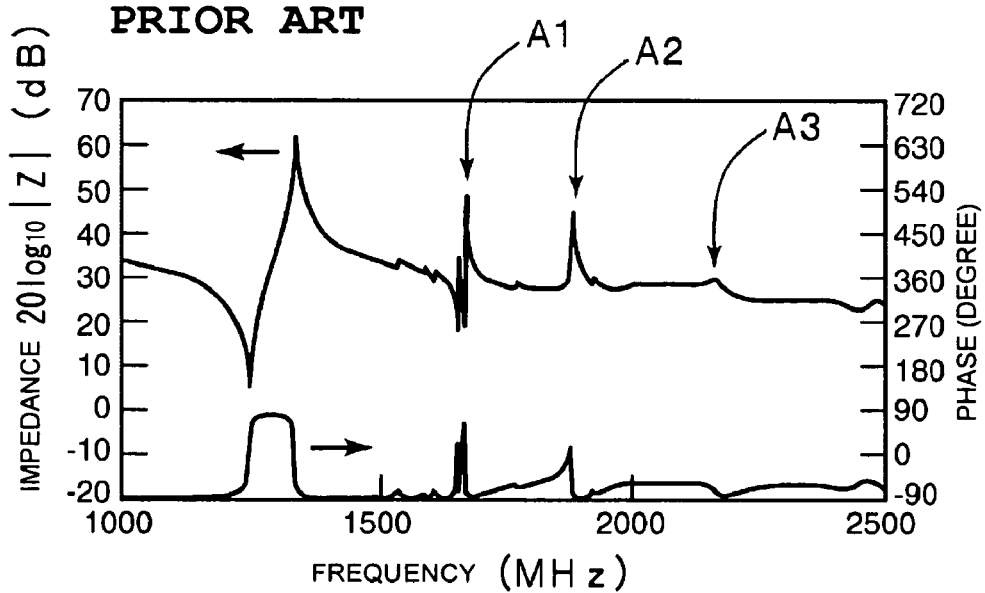
FIG. 34 is a representation of spurious modes presented in the impedance-frequency characteristics of a known boundary acoustic wave device.
Figure 35:
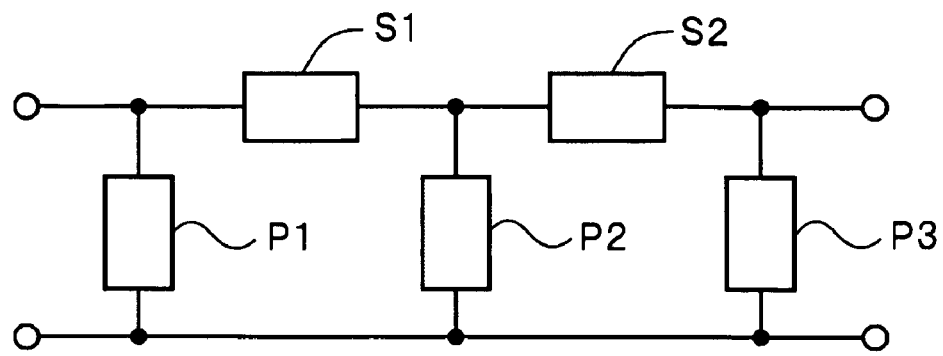
FIG. 35 is a ladder-type circuit including a plurality of known boundary acoustic wave devices.

As is clear from the comparison of FIGS. 8 and 34, while the impedance ratio (ratio of impedance at the resonant frequency to that at the antiresonant frequency) of the spurious response around 1700 MHz is 29.3 dB in FIG. 34, it is remarkably reduced to about 7.1 dB in the present preferred embodiment. Hence, undesired spurious responses in the high frequency region can be reduced effectively by providing the sound absorbing layer 7.

However, the spurious response around 1700 MHz is not completely eliminated in the frequency characteristics shown in FIG. 8.

The present inventors have discovered that when acoustic waves propagate through a multilayer composite including a layer with a low acoustic velocity and a layer with a high acoustic velocity, the acoustic waves propagate with their energy concentrated on the low-acoustic-velocity layer. Accordingly, the sound absorbing layer 7 on the surface of the second medium layer is formed of a material having a low acoustic wave velocity and thus, a multilayer composite of sound absorbing layer 7/second medium layer/electrode/first medium layer 2 is formed, so that energy in modes producing spurious responses is transferred from the second medium layer to the sound absorbing layer 7.

More specifically, the sound absorbing layer 7 serves as a sound absorbing medium, and the energy of the spurious modes transferred to the sound absorbing layer 7 does not return to the second medium layer 6. In this instance, the boundary acoustic waves, which are main responses of the boundary acoustic wave device 1, propagate with their energy concentrated on the vicinity of the interface. Therefore, the energy of the boundary acoustic waves is difficult to reduce.

In the analyses shown in FIGS. 2 to 7, three types of spurious modes were found: one is essentially composed of SV waves; another is essentially composed of SH waves; and the other is essentially composed of P waves.

Hence, in order to highly reduce spurious modes essentially composed of SH waves or SV waves, the transverse acoustic wave velocity in the sound absorbing layer 7 can be lower than the transverse acoustic wave velocity in the second medium layer. In order to reduce spurious modes essentially composed of P waves effectively, the longitudinal acoustic wave velocity in the sound absorbing layer 7 can be lower than the longitudinal acoustic wave velocity in the second medium layer.

The energy T of a mode transferring from the second medium layer 6 to the sound absorbing layer 7 is expressed by $T=4Z_0 Z_L/(Z_0+Z_L)^2$, wherein $Z_0$ represents the acoustic characteristic impedance of the second medium layer 6, and $Z_L$ represents the acoustic characteristic impedance of the sound absorbing layer 7.

As is clear from the above-described equation, the closer the acoustic characteristic impedance $Z_0$ of the second medium layer 6 to the acoustic characteristic impedance $Z_L$ of the sound absorbing layer 7, the higher the energy T transferring from the second medium layer 6 to the sound absorbing layer 7. Thus, spurious modes can be efficiently reduced.

Accordingly, in order to reduce the spurious modes essentially composed of SH waves or SV waves, it is preferable that the acoustic characteristic impedances of the second medium layer 6 and the sound absorbing layer 7 for transverse waves be matched to each other, that is, be brought close to each other. Also, in order to reduce the spurious modes essentially composed of P waves, it is preferable that the acoustic impedances of the second medium layer 6 and the sound absorbing layer 7 for longitudinal waves be matched to each other.

Therefore, the sound absorbing layer 7 is preferably made of a material having a lower acoustic velocity than the second medium layer, high acoustic matching with the second medium layer, and a high sound absorbing effect.

In order to confirm this conclusion, an analysis was conducted using the boundary acoustic wave device 1 shown in FIG. 1. In this analysis, the first medium layer 2 was made of a 15° Y—X LiNbO$_3$ substrate with an infinite thickness, and the second medium layer 6 was made of a 1.5λ thick SiO$_2$ film. The IDT was made of a 0.05λ thick Au film. The displacement and the vertical stress at the interfaces between the sound absorbing layer 7 and the SiO$_2$ film, between the SiO$_2$ film and the Au, and between the Au and the LiNbO$_3$ were continuous, and the potential was 0 by the short-circuited interfaces between the SiO$_2$ and Au and between the Au and the LiNbO$_3$. The sound absorbing layer 7 was considered to be isotropic and of infinite thickness. Thus, the manner was simulated in which waves passing from the SiO$_2$ film to the sound absorbing layer 7 are absorbed. The acoustic velocity and the propagation loss of boundary waves and spurious mode waves were obtained using this structure.

The acoustic velocity of and the acoustic characteristic impedance for longitudinal waves and transverse waves propagating through an isotropic material will now be described. When the acoustic velocity of transverse waves is Vs, the acoustic velocity of longitudinal waves is Vp, and the acoustic characteristic impedance for the transverse waves is Zs, and the acoustic characteristic impedance for the longitudinal waves is Zp; Vs and Vp are expressed by the following equations with the elastic stiffness coefficients C11 and C12 and the density ρ of the isotropic material.

Equation 1:

$$Vs = \sqrt{\frac{C11 - C12}{2\rho}}$$

$$Vp = \sqrt{\frac{C11}{\rho}}$$

$$Zs = \rho Vs$$

$$Zp = \rho Vp$$

FIGS. 9A to 10B show the relationships between the density ρ of the sound absorbing layer of the boundary acoustic wave device and the acoustic velocity of propagating boundary waves, a spurious mode mainly containing component U2, and a spurious mode mainly containing component U3, and the relationships between the transverse acoustic wave velocity Vs of the sound absorbing layer and the attenuation constant in these modes. The boundary acoustic wave device had the same structure as in above, except that the density ρ of the sound absorbing layer was varied.

Figure 9A:
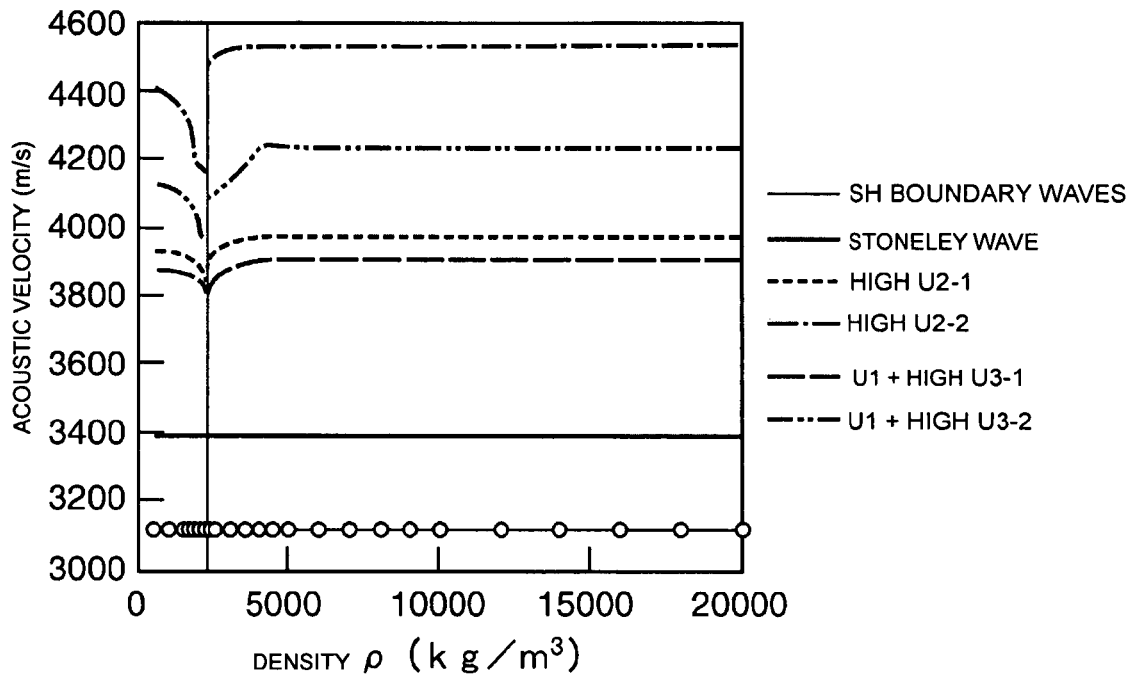
FIGS. 9A and 9B are graphs showing the changes in acoustic velocity and attenuation constant of SH boundary waves, Stoneley waves, and various spurious modes when the density ρ of the sound absorbing layer is varied.
Figure 9B:
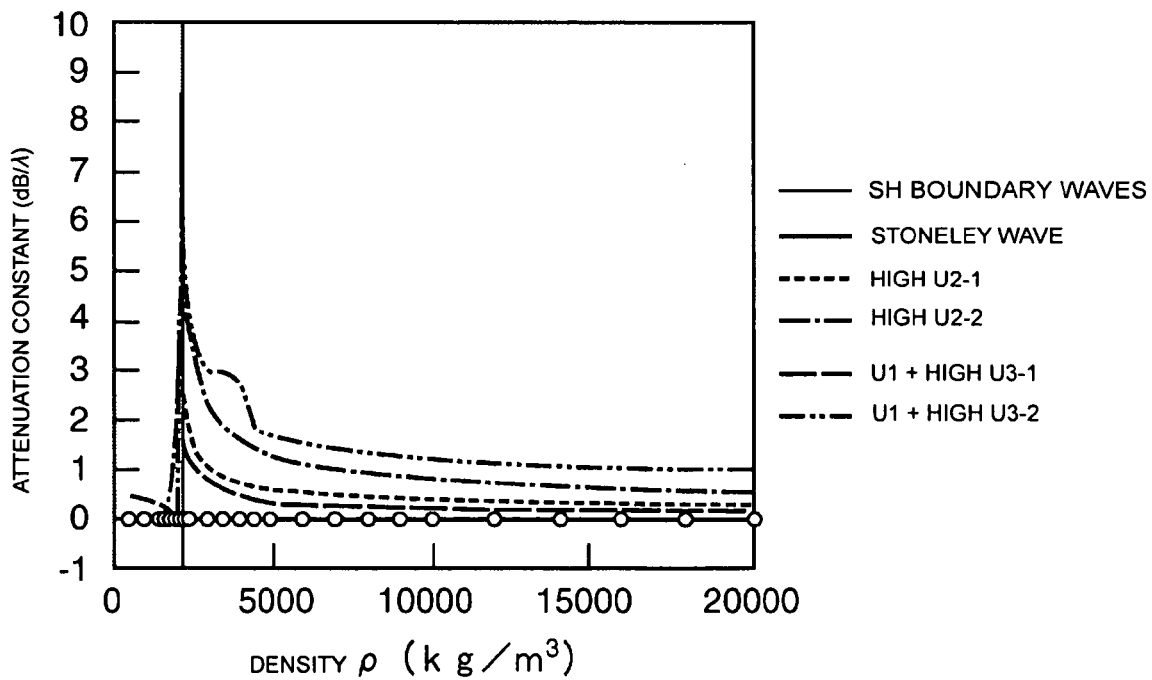
Figure 10A:
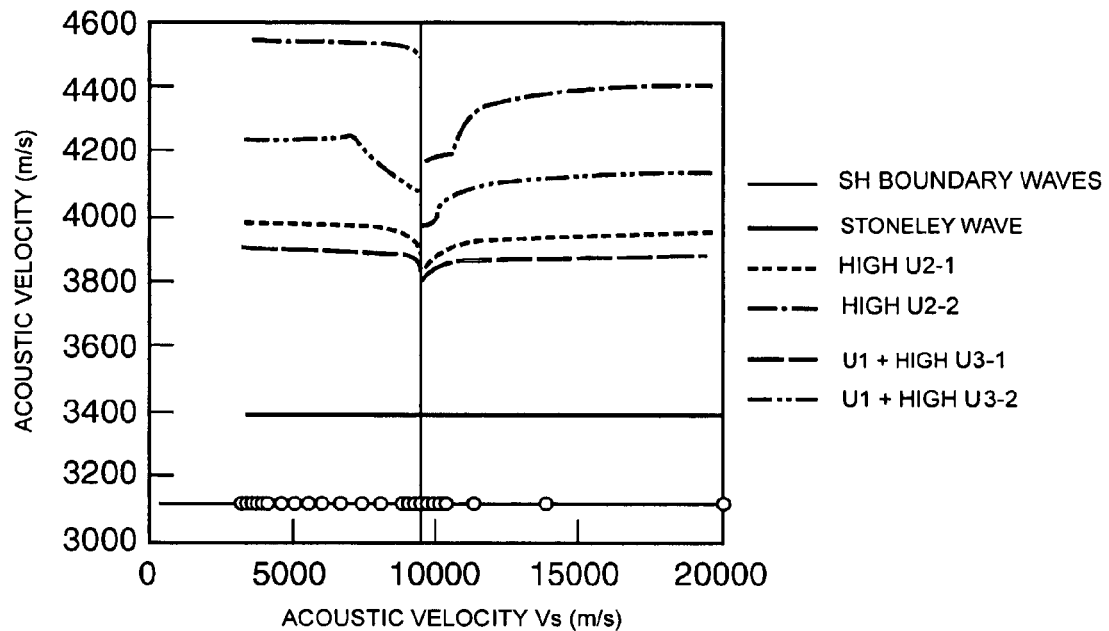
FIGS. 10A and 10B are graphs showing the changes in acoustic velocity and attenuation constant of SH boundary waves, Stoneley waves, and various spurious modes when the transverse acoustic wave velocity Vs of the sound absorbing layer is varied.
Figure 10B:
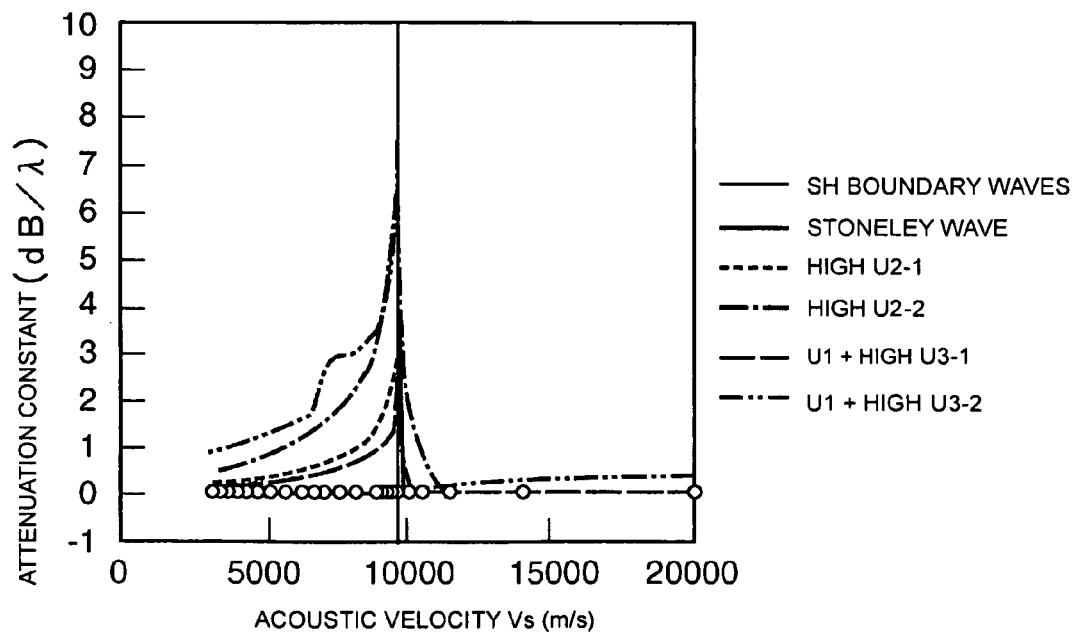

In FIG. 9A to below-described FIG. 12B, the spurious modes mainly containing component U2 include a high U2-1 mode in which component U2 is of a lower degree, and a high U2-2 mode in which component U2 is of a higher degree. The spurious modes mainly containing component U3 include a high U3-1 mode in which component U3 is of a lower degree, and a high U3-2 mode in which component U3 is of a higher degree.

SiO$_2$ has a transverse acoustic wave velocity of 3757 m/s and a density of 2210 kg/m$^3$. Accordingly, when the sound absorbing layer has a transverse acoustic wave velocity of 3757 m/s and a density of 2210 kg/M$^3$, the attenuation constant in spurious modes becomes the maximum and spurious responses are suppressed. In contrast, SH boundary waves and Stoneley waves are not attenuated at all. In the structure used for the calculation, the electromechanical coupling coefficient of Stoneley waves is about 0, as mentioned above. As a result, Stoneley waves can propagate, but do not produce spurious responses because they are not excited.

Figure 11A:
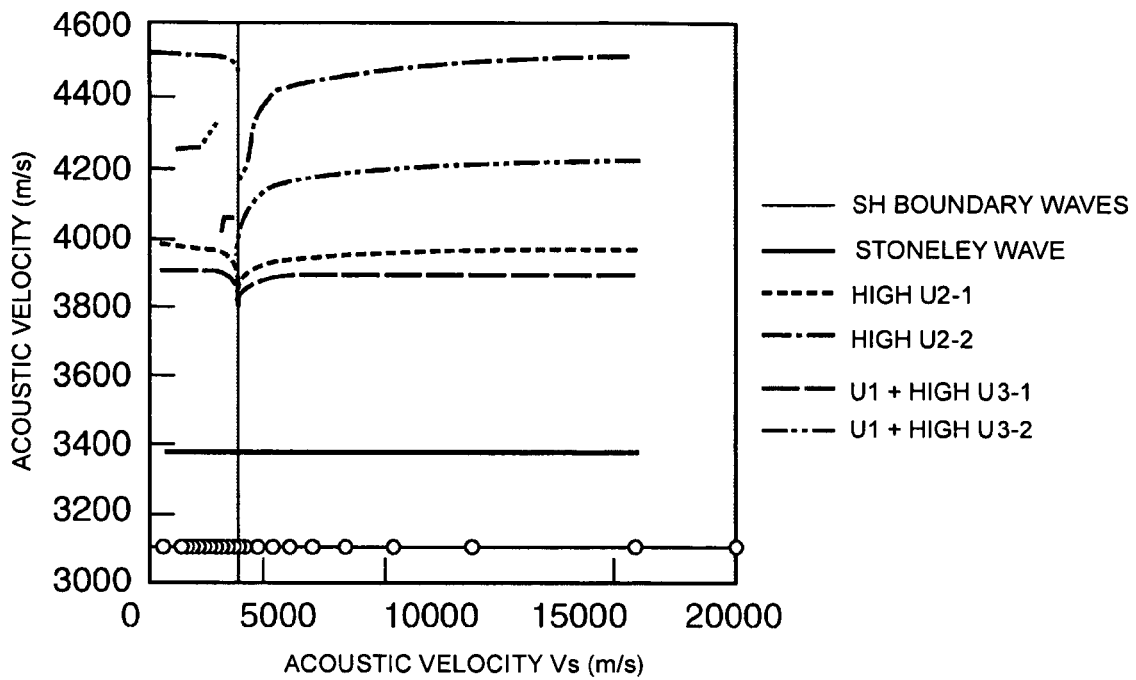
FIGS. 11A and 11B are graphs showing the changes in acoustic velocity and attenuation constant of SH boundary acoustic waves, Stoneley waves, and various spurious modes when the transverse acoustic wave velocity Vs of the sound absorbing layer is varied under the condition where the acoustic characteristic impedance Zs of the sound absorbing layer is fixed.
Figure 11B:
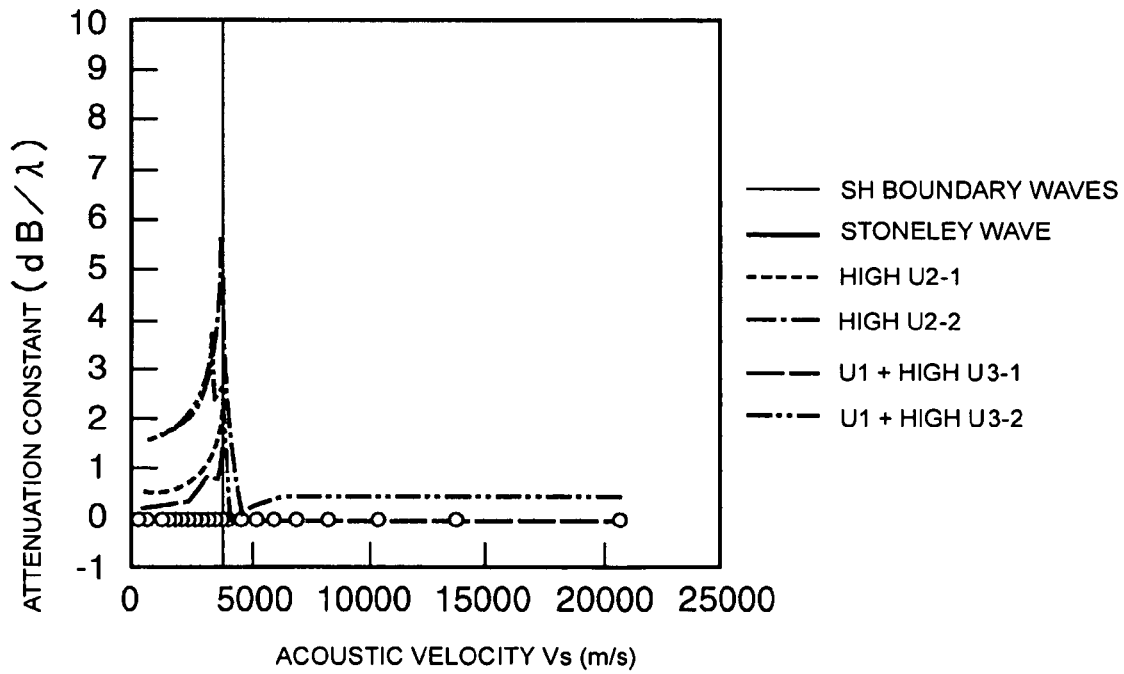

Since, in the structure used for FIGS. 9A to 10B, only the density of the sound absorbing layer was varied, the effects of the transverse acoustic wave velocity and the acoustic characteristic impedance for the transverse waves in the sound absorbing layer cannot be estimated. Accordingly, the acoustic characteristic impedance Zs for transverse waves in the sound absorbing layer was a value equal to the acoustic characteristic impedance of about 8.30×10$^6$ kg/m$^2$·s of SiO$_2$ for transverse waves, and a constant was determined from the equation below. Then the relationships between the acoustic velocity and the attenuation constant for SH boundary acoustic waves, spurious mode waves mainly containing component U2, and spurious mode waves mainly containing component U3 were obtained by varying the transverse acoustic wave velocity Vs of the sound absorbing layer. The results are shown in FIGS. 11A and 11B.

$$C11 = C12 + 2Zs^2/\rho$$

Then, the transverse acoustic wave velocity Vs in the sound absorbing layer was about 3,757 m/s and a constant was determined from the equation below. The relationship between the acoustic velocity and the attenuation constant for SH boundary waves, spurious mode waves mainly containing component U2, and spurious mode waves mainly containing component U3 were obtained by varying the acoustic characteristic impedance Zs. The results are shown in FIGS. 12A and 12B.

$$C11 = C12 + 2\rho Vs^2$$

Figure 12A:
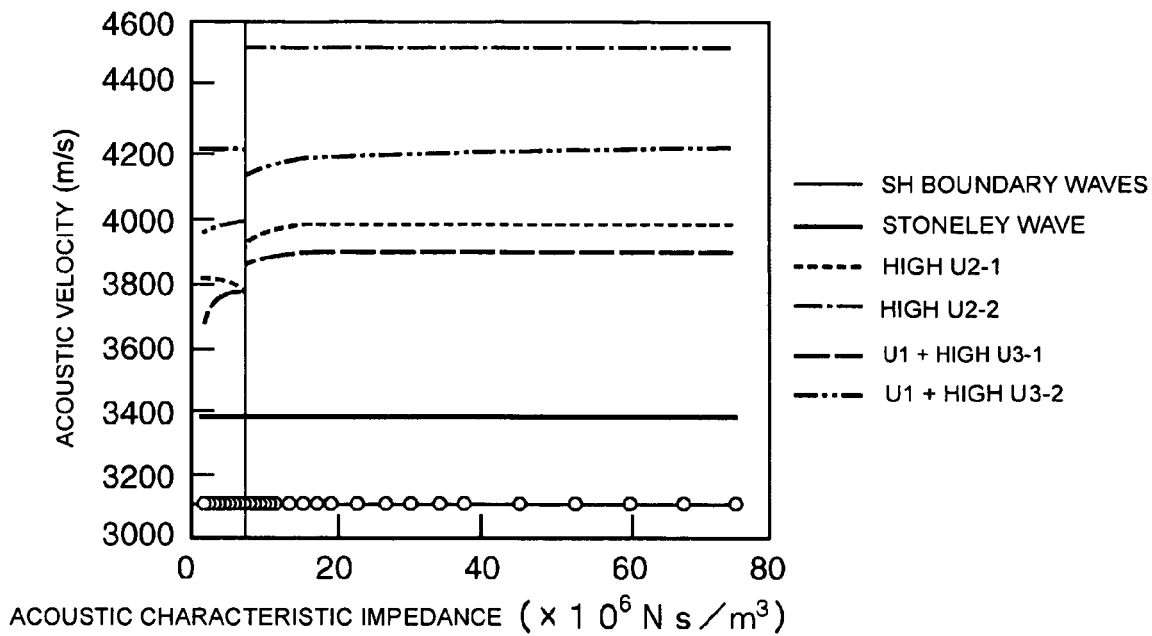
FIGS. 12A and 12B are graphs showing the changes in acoustic velocity and attenuation constant of SH boundary waves, Stoneley waves, and various spurious modes when the acoustic characteristic impedance Zs of the sound absorbing layer is varied under the condition where the transverse acoustic wave velocity of the sound absorbing layer is fixed.
Figure 12B:
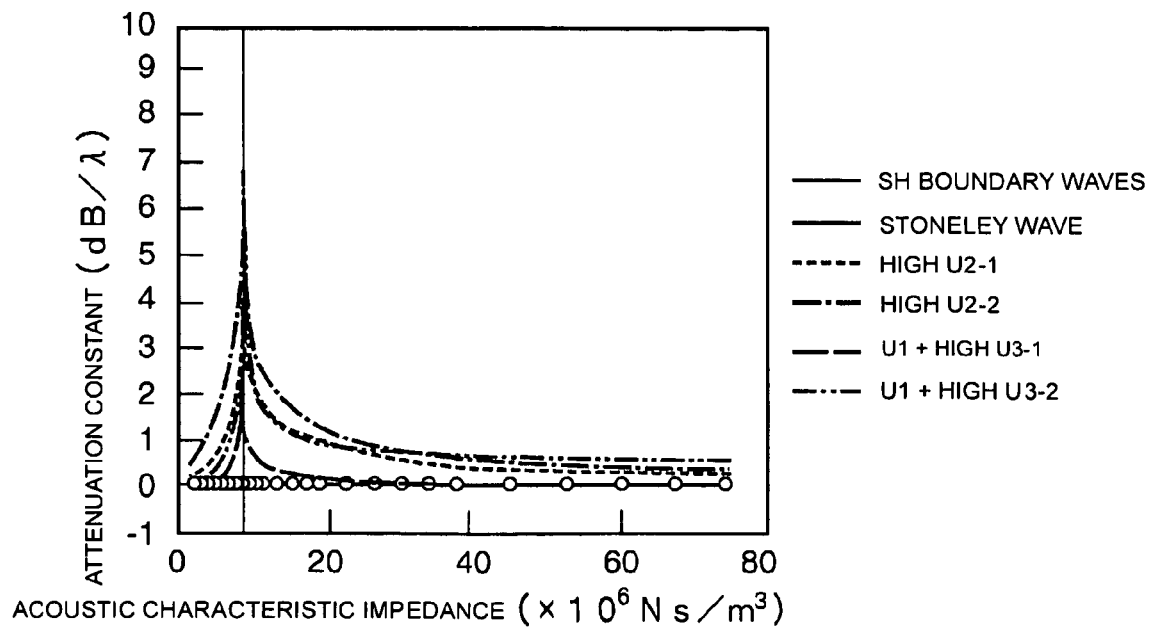

FIGS. 12A and 12B show that the closer is the transverse acoustic wave velocity Vs in the sound absorbing layer to 3757 m/s, or the acoustic velocity of SiO$_2$, the larger are the attenuation constants in spurious modes, and that when the velocity of acoustic waves is lower than the acoustic velocity of SiO$_2$, the attenuation constant is increased. An IDT used in a boundary acoustic wave device generally has about 10 to about 50 pairs of electrode fingers, and the range of the aperture is about 10λ to about 50λ relative to the propagation wavelength. The calculated attenuation constant ax represents energy radiation in the ±X$_3$ directions. When the attenuation constant in a spurious mode is about 0.5 dB/λ, an IDT of 10λ exhibits an attenuation of, for example, about 5 dB and an IDT of about 50λ exhibits an attenuation of, for example, about 25 dB. These attenuations result from the radiation of acoustic waves to the sound absorbing layer.

In addition, the sound absorbing effect of the sound absorbing layer increases the attenuation. Thus, spurious responses can be sufficiently suppressed. If the attenuation constant in spurious modes is at least about 1.0 dB/λ to 1.5 dB/λ, spurious responses can further be minimized.

It was shown that, when the transverse acoustic wave velocity Vs in the sound absorbing layer was preferably about 0.13 to about 1.23 times as high as the transverse acoustic wave velocity in the $SiO_2$, spurious modes mainly containing a higher degree of component U2 or U3, or high U2-2 modes and high U3-2 modes, were attenuated by about 1.5 dB/λ or more, and a spurious mode mainly containing a lower degree of component U2, or a high U2-1 mode, was attenuated by about 0.5 dB/λ or more. More preferred transverse acoustic wave velocity Vs in the sound absorbing layer is about 0.6 to about 1.00 times the transverse acoustic wave velocity in the $SiO_2$. In this case, a spurious mode mainly containing a lower degree of component U3, or high U3 mode, is attenuated by about 0.5 dB or more. In modes mainly containing the same type of partial waves, as the degree is reduced, the electromechanical coupling coefficient tends to increase and spurious responses tend to be larger.

The spurious mode denoted by high U2-2 which mainly contains the second higher degree of component U2 has an attenuation constant of about 0.003 dB/λ, even if the transverse acoustic wave velocity Vs in the sound absorbing layer is 5,000 m/s or more. Also, the spurious mode mainly containing the second higher degree of component U3 (high U3-2) has an attenuation constant of about 0.477 dB/λ, even if transverse acoustic wave velocity Vs in the sound absorbing layer is 5,000 m/s or more. These attenuation constants result from energy radiation toward the single crystal substrate that occurs due to higher acoustic velocities of the spurious modes than the acoustic velocity of SH waves or SV waves in the $LiNbO_3$ single crystal substrate.

FIGS. 12A and 12B also show that the closer is the acoustic characteristic impedance Zs of the sound absorbing layer to the acoustic characteristic impedance of about $8.30 \times 10^6$ kg/m²·s of $SiO_2$, the higher are the attenuation constants in spurious modes. The spurious mode denoted by high U2-1 is attenuated by about 0.5 dB/λ or more when the acoustic characteristic impedance Zs of the sound absorbing layer is about 0.45 to about 3.61 times the acoustic characteristic impedance of $SiO_2$; it is favorably attenuated by about 1.0 dB/k or more when Zs is about 0.75 to about 1.99 times the acoustic characteristic impedance; it is more favorably attenuated by about 1.5 dB/λ or more when Zs is about 0.89 to about 1.48 times the acoustic characteristic impedance.

The spurious mode denoted by high U2-2 is attenuated by about 0.5 dB/λ or more when the acoustic characteristic impedance of the sound absorbing layer is about 0.20 to about 5.30 times the acoustic characteristic impedance of $SiO_2$, favorably attenuated by about 1.0 dB or more when it is about 0.41 to about 3.25 times the acoustic characteristic impedance, and more favorably attenuated by about 1.5 dB/k or more when it is about 0.57 to about 1.88 times the acoustic characteristic impedance.

The spurious mode denoted by high U3-1 is attenuated by about 0.5 dB/λ or more when the acoustic characteristic impedance Zs of the sound absorbing layer is about 0.84 to about 1.29 times the acoustic characteristic impedance of $SiO_2$, favorably attenuated by about 1.0 dB/λ or more when it is about 0.96 to about 1.08 times the acoustic characteristic impedance, and more favorably attenuated by about 1.5 dB or more when it is about 0.99 to about 1.02 times the acoustic characteristic impedance.

The spurious mode denoted by high U3-2 is attenuated by about 0.5 dB/λ or more when the acoustic characteristic impedance Zs of the sound absorbing layer is about 0.71 times or more the acoustic characteristic impedance of $SiO_2$, favorably attenuated by about 1.0 dB/λ or more when it is about 0.76 to about 1.98 times the acoustic characteristic impedance, and more favorably attenuated by about 1.5 dB/λ or more when it is about 0.89 to about 1.47 times the acoustic characteristic impedance.

Figure 13:
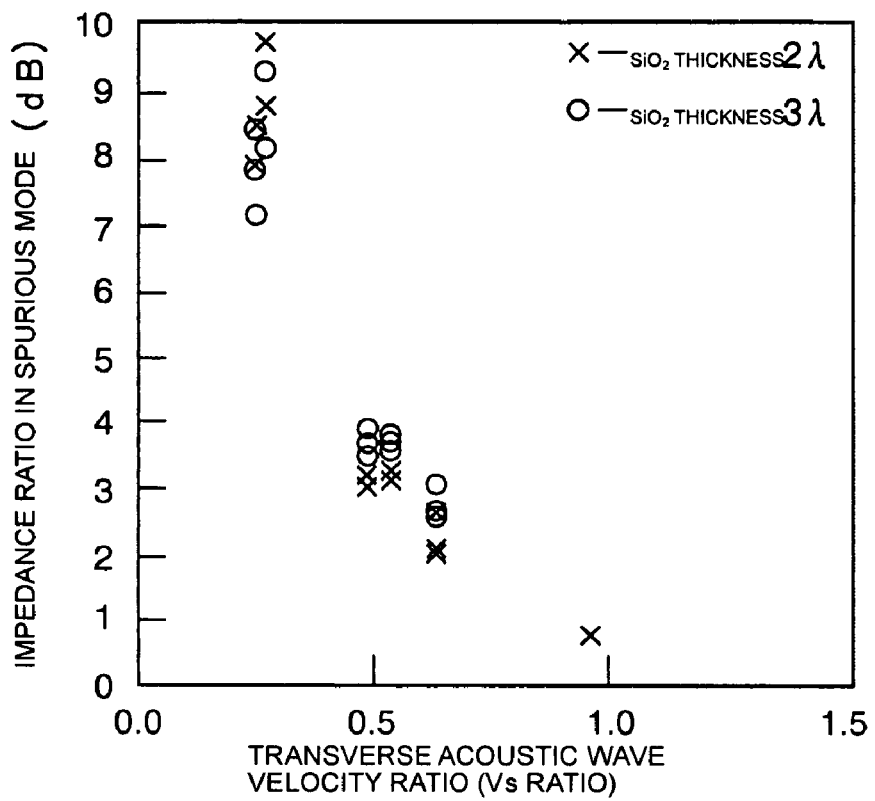
FIG. 13 is a graph showing the relationship between the transverse acoustic wave velocity ratio and the impedance ratio in spurious modes when the thickness of the $SiO_2$ film is varied.
Figure 14:
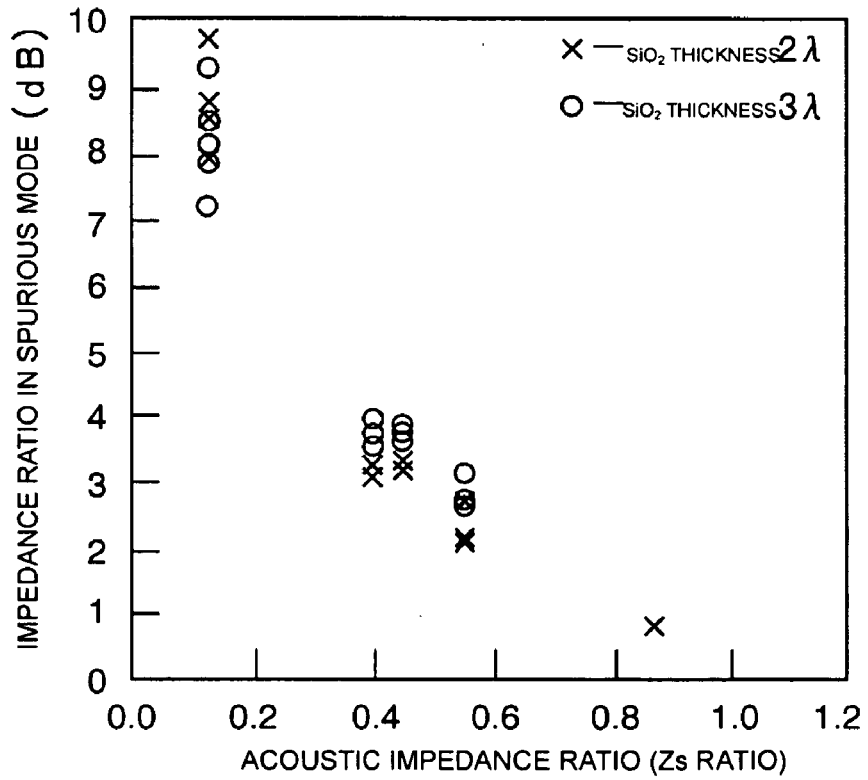
FIG. 14 is a graph showing the relationship between the acoustic impedance ratio and the impedance ratio in spurious modes when the thickness of the $SiO_2$ film is varied.

In order to prove the calculations, experiments were conducted. Boundary acoustic wave devices 1 according to the preferred embodiment shown in FIG. 1 were prepared by forming a variety of sound absorbing layers tightly on the surface of the $SiO_2$ of the boundary acoustic wave resonator having the characteristics shown in FIG. 34, prepared as a comparative example. FIG. 13 shows the relationship between the transverse acoustic wave velocity ratio (Vs ratio) and the impedance ratio in spurious modes. The Vs ratio is obtained by dividing the transverse acoustic wave velocity of the sound absorbing layer by the transverse acoustic wave velocity of $SiO_2$. FIG. 14 shows the relationship between the acoustic impedance ratio (Zs ratio) and the impedance ratio in spurious modes. The Zs ratio is obtained by dividing the acoustic impedance of the sound absorbing layer for transverse waves by the acoustic impedance of $SiO_2$ for the transverse waves. The impedance ratio in spurious modes refers to the fact that in a spurious mode where the ratio of the impedance at the resonant frequency to the impedance at the antiresonant frequency is highest.

The above-described boundary acoustic wave device has an impedance ratio in spurious modes of about 7.1 dB or more when the Vs ratio is about 0.273 and the Zs ratio is about 0.127. However, if the Zs ratio of the sound absorbing layer is about 0.393 or more, the impedance ratio in spurious modes decreases to about 3.9 dB or less, and thus the impedance ratio in spurious modes decreases as the Zs ratio becomes closer to 1. If the Vs ratio is about 0.488 or more, the impedance ratio in spurious modes decreases to about 3.9 dB or less, and thus the impedance ratio in spurious modes decreases as the Vs ratio becomes closer to 1.

Figure 15:
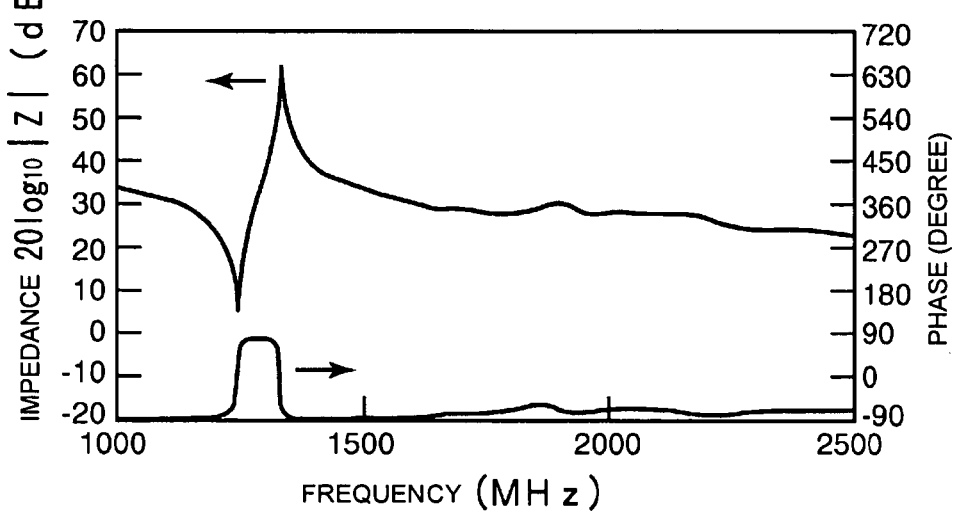
FIG. 15 is a graph showing the impedance-frequency characteristics and the phase-frequency characteristics of a boundary acoustic wave resonator according to a preferred embodiment of the present invention.
Figure 16:
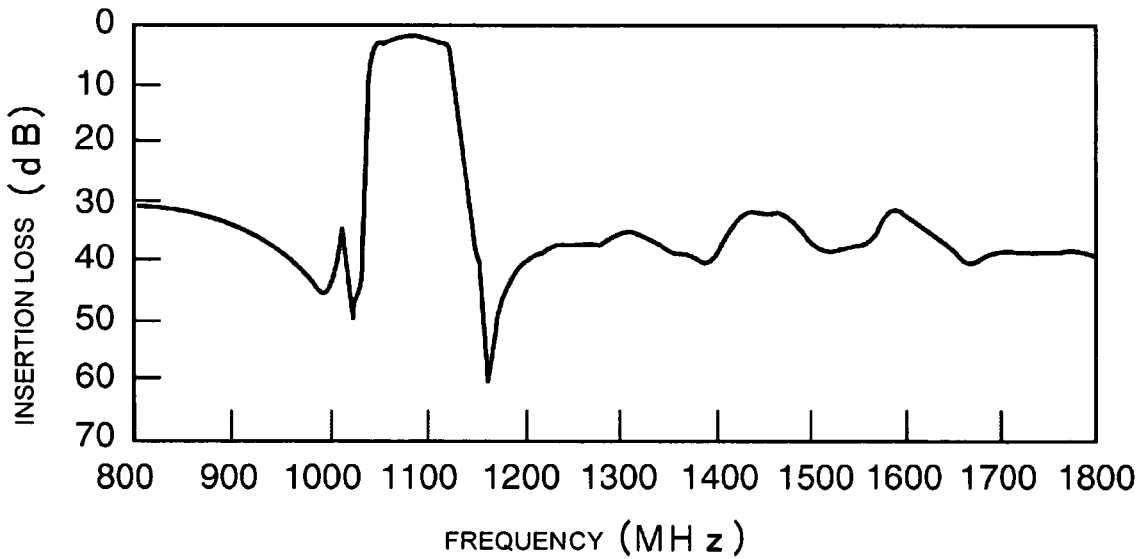
FIG. 16 is a graph showing the attenuation-frequency characteristics of a boundary acoustic wave filter according to a preferred embodiment of the present invention.

FIG. 15 shows the resonance characteristics of a boundary acoustic wave resonator having a sound absorbing layer with a Vs ratio of about 0.633 and a Zs ratio of about 0.547 on the surface of the $SiO_2$ film. FIG. 16 shows the filter characteristics of a ladder-type filter using the boundary acoustic wave resonators.

While the attenuation constant for transverse waves was about 7.1 dB/λ in FIG. 8 when the sound absorbing layer produced the sound absorbing effect, the structure having the characteristics shown in FIGS. 15 and 16 showed that the attenuation constant for transverse waves of the sound absorbing layer was about 1.75 dB/λ. These results suggest that a sound absorbing layer simply having a large attenuation constant cannot sufficiently suppress spurious modes, and that the spurious modes can be suppressed more effectively by matching the acoustic impedance.

In a preferred embodiment of the present invention, the sound absorbing layer may be made of the same type of material as the second medium layer. Even in such a case, the attenuation constant can be reduced only in the region where the energy of boundary acoustic waves, or in the main response, are present, while being increased in its external region. The above-mentioned "same type of material" does not necessarily mean one and the same material. For example, if $SiO_2$ is used, two $SiO_2$ films may have different characteristics depending on the deposition method, as described below. The same type of material can be a combination of two different $SiO_2$ films. In the deposition of the second medium layer by sputtering, in general, low-quality materials having high attenuation constants can be deposited at a high speed and are inexpensive, while high-quality materials having low attenuation constants are deposited at a low speed and are expensive. For example, a boundary acoustic wave device having a SiO$_2$ film/Al electrode/Au electrode/LiNbO$_3$ structure may be provided with a second SiO$_2$ film serving as the sound absorbing layer over that SiO$_2$ film. In this instance, the SiO$_2$ film serving as the second medium layer can be formed of a high-quality SiO$_2$ film having a low attenuation constant to a thickness of, for example, about 0.5λ, and the second SiO$_2$ film serving as the sound absorbing layer can be formed of a low-quality SiO$_2$ film having a high attenuation constant to a thickness of, for example, about 1.0λ. This structure can facilitate the suppression of spurious responses at a low cost almost without degrading the characteristics of the boundary acoustic wave device. In this instance, the high-quality SiO$_2$ film has an elastic constant and a density close to those of the low-quality SiO$_2$ film, and accordingly the displacement distribution of the boundary acoustic waves in the main mode hardly changes in the depth direction. Although the low-quality film and the high-quality film can be continuously formed with the same apparatus, the low-quality film may be formed in a below-described process. Specifically, either the high-quality film or the low-quality film may be formed by one of sputtering, spin coating, screen printing, and CVD, and the other film may be formed by any one of the other methods.

Figure 17:
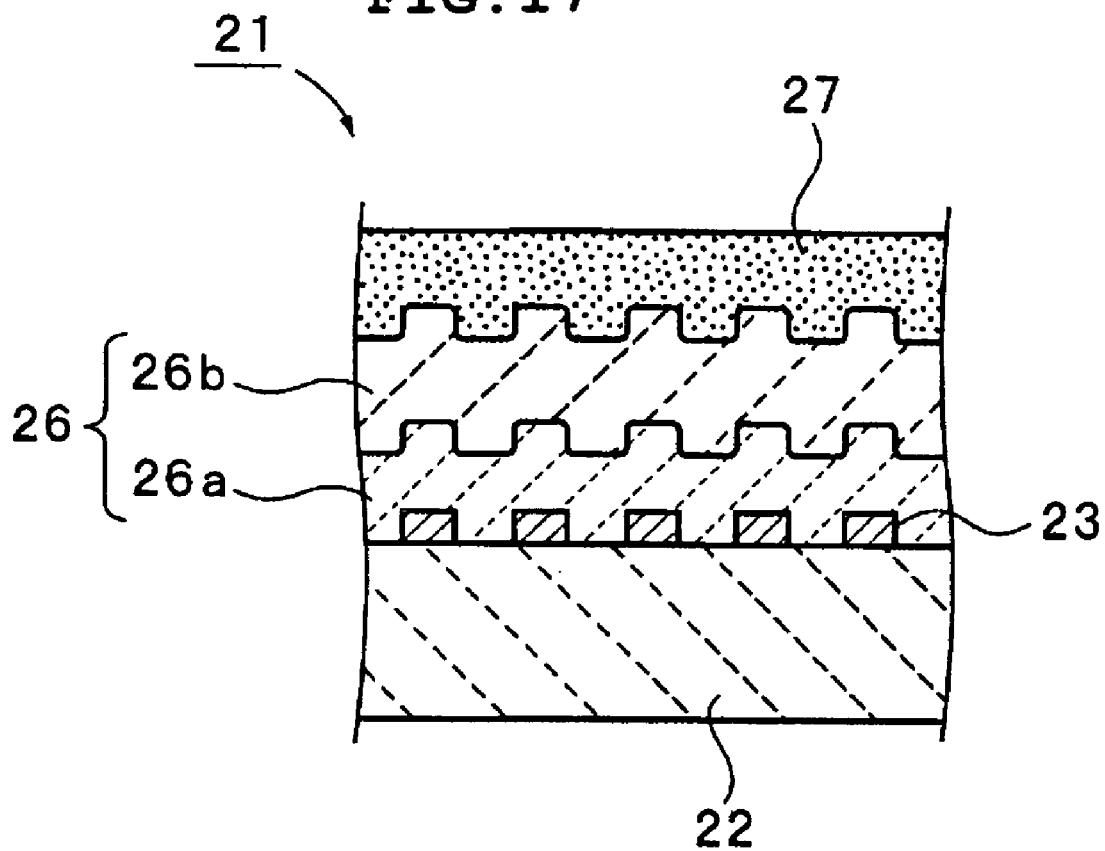
FIG. 17 is a fragmentary front sectional view of a boundary acoustic wave device according to a modification of a preferred embodiment of the present invention.

The first and the second medium layer are not necessarily formed by the same first material layer. For example, the second medium layer may have a multilayer structure composed of a plurality of medium material layers. FIG. 17 is a fragmentary front sectional view of a modification of the boundary acoustic wave device whose second medium layer has a multilayer structure. In this boundary acoustic wave device 21, an IDT 23 is provided on a first medium layer 22, and the IDT 23 is covered with a second medium layer 26. The second medium layer 26 has a structure formed by depositing a medium material layer 26b on another medium material layer 26a. In addition, a sound absorbing layer 27 is provided on the second medium layer 26.

The medium material layers 26a and 26b are each made of an appropriate material. For example, the medium material layer 26a is preferably made of SiO$_2$ and the other medium material layer is preferably made of SiN. The second medium layer may be formed by depositing three or more layers.

The multilayer structure may be constituted of a medium material layer having a high attenuation constant and a medium material layer having a low attenuation constant. The high attenuation constant medium material layer and the low attenuation constant medium material layer may be alternately deposited. Many of the medium material layers having low attenuation constants are superior in compactness. By providing such a medium material layer at the outer side from the interface, the moisture resistance around the interface can be enhanced.

In a preferred embodiment of the present invention, the first medium layer may have a multilayer structure as well. One of the unique characteristics of a preferred embodiment of the present invention is that spurious modes are minimized by reducing the attenuation constant of the boundary waves-propagating material at the interface where boundary waves propagate and in its vicinity, and by providing the sound absorbing layer on at least a portion of an outer layer. A preferred embodiment of the present invention is also characterized in that the acoustic characteristic impedance of the sound absorbing layer is matched to that of the boundary wave propagating medium layer as described above to enhance the sound absorbing efficiency of the sound absorbing layer, and that the acoustic velocity in the sound absorbing layer is reduced so that spurious modes turn to leaking modes, thereby suppressing spurious responses effectively. It is therefore preferable that the attenuation constant of the sound absorbing layer for acoustic waves be higher than that of the first and the second medium layer.

The material of the sound absorbing layer used in a preferred embodiment of the present invention is not particularly limited as long as its attenuation constant for acoustic waves is larger than that of the first and the second medium layer. Examples of the materials used for forming the sound absorbing layer include resins, such as epoxy, phenol, acrylate, polyester, silicone, urethane, and polyimide; glasses, such as low-melting-point glass and water glass; alumina ceramics; and metals.

In particular, many resin materials have high attenuation constants and their compositions can be easily controlled, and accordingly resin material can form sound absorbing layers having a variety of acoustic velocities and acoustic characteristic impedances. Thus, the sound absorbing layer is preferably made of a resin material.

Figure 18:
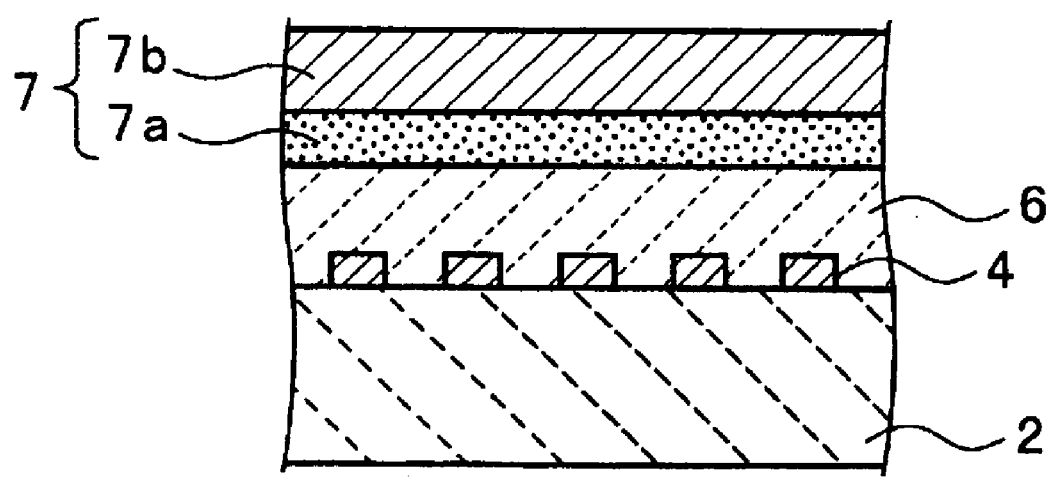
FIG. 18 is a fragmentary front sectional view of a boundary acoustic wave device according to another modification of a preferred embodiment of the present invention.

The sound absorbing layer may have a multilayer structure formed by depositing a plurality of sound absorbing material layers. For example, the boundary acoustic wave device 31 of the modification shown in FIG. 18 has a sound absorbing layer 7 formed by depositing a first sound absorbing material layer 7a and a second sound absorbing material layer 7b, on the upper surface of the second medium layer 6. In this instance, the acoustic characteristic impedance of the sound absorbing material layer 7a is preferably between the acoustic characteristic impedances of the second medium layer 6 and the second sound absorbing material layer 7b, so that the matching of acoustic characteristic impedances can be enhanced. Since the sound absorbing material layer 7a in this instance is intended to ensure the acoustic matching between the second medium layer 6 and the sound absorbing material layer 7b, the sound absorbing material layer 7a preferably has a higher attenuation constant than the medium layer 6. However, the attenuation constant is not always required to be higher than that of the medium layer 6. In FIG. 18, description of previously discussed elements and reference numerals is omitted here for simplicity.

Figure 19:
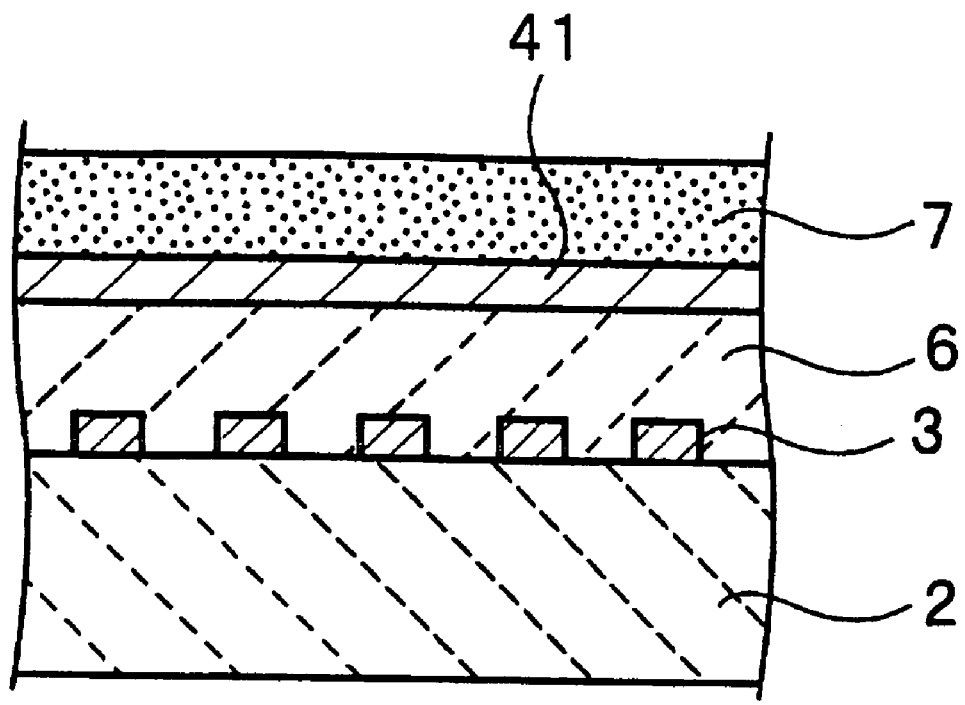
FIG. 19 is a fragmentary front sectional view of a boundary acoustic wave device according to another modification of a preferred embodiment of the present invention.
Figure 20:
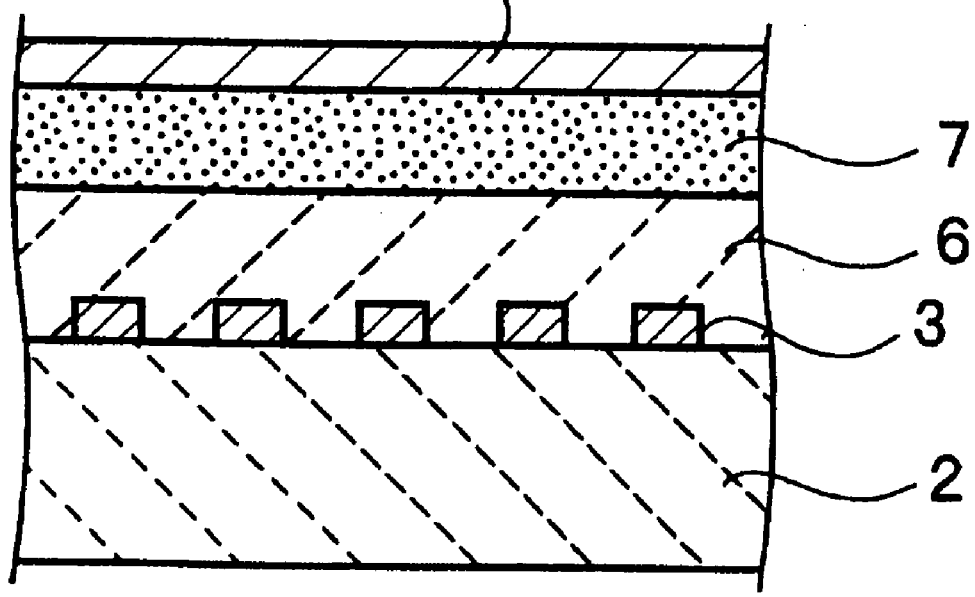
FIG. 20 is a fragmentary front sectional view of a boundary acoustic wave device according to another modification of a preferred embodiment of the present invention.

The boundary acoustic wave device of the present preferred embodiment may have an electrically conductive layer 41 under the sound absorbing layer 7, as shown in FIG. 19. Also, an electrically conductive layer 42 may be provided on the upper surface of the sound absorbing layer 7, as shown in FIG. 20. Thus, in the present preferred embodiment, an electrically conductive layer can be provided on at least either the upper or the lower surface of the sound absorbing layer, thereby preventing the degradation of attenuation, which results from, for example, directly transmitted electromagnetic waves between the input terminal and the output terminal in a filter. Preferably, the electrically conductive layers 41 and 42 are provided in regions opposing the region having the IDT and the reflectors with the medium layers therebetween, thereby preventing the degradation of attenuation effectively. In FIGS. 19 and 20, description of previously discussed elements and reference numerals is omitted here for simplicity.

If the IDT includes an input IDT and an output IDT, it is preferable that the electrically conductive layer be divided into a portion opposing the input IDT with a medium layer therebetween and a portion opposing the output IDT with the medium layer therebetween, and that the portions are grounded with their respective wiring electrodes. The degradation of attenuation thus can be prevented more effectively.

Preferably, the sound absorbing layer 7 of the boundary acoustic wave device according to a preferred embodiment of the present invention is made of a resin material, such as resin adhesive. If a gas remains in the resin material, however, the sound absorbing layer can be cracked during reflow soldering, or the gas comes out over time to vary the stress on the chip, so that the frequency characteristics can be changed disadvantageously. In order to prevent these problems, the gas is preferably removed in a vacuum in the step of forming the sound absorbing layer of a resin material after the sound absorbing layer is applied at, for example, room temperature. In this instance, the sound absorbing material layer can be cured by heating in a vacuum.

In the boundary acoustic wave device of the present preferred embodiment of the present invention, a wiring electrode may be provided for wiring on the upper surface of the second medium layer or the sound absorbing layer. For example, a boundary acoustic wave device 51 according to the modification shown in FIG. 21 has a wiring electrode 52 on the upper surface of the sound absorbing layer 7. An end of the wiring electrode 52 is electrically connected to the IDT 3 through a through-hole electrode 53, a through-hole electrode 54, and another wiring electrode 55. In this modification, the through-hole electrode 53 is provided in the sound absorbing layer 7, and the through-hole electrode 54 is provided in the second medium layer 6.

For example, if the first medium layer 2 is made of a LiNbO$_3$ substrate and the second medium layer 6 is made of SiO$_2$, the dielectric constant of the first medium layer 2 is relatively high and the dielectric constant of the second medium layer 6 is relatively low. In this case, the wiring electrode 52 or the like is preferably provided on the upper surface of the second medium layer 6 for electrically connecting the above-described types of electrodes to each other, thereby reducing the parasitic capacitance produced by wiring. For example, if the first medium layer 2 is made of a glass substrate, the second medium layer 6 is made of a ZnO thin film, and the sound absorbing layer 7 is made of a dielectric material with a low dielectric constant, the dielectric constant of the second medium layer 6 is relatively high and the dielectric constant of the sound absorbing layer 7 is relatively low. In this case, the wiring electrode or the like for wiring is preferably provided on the upper surface of the sound absorbing layer 7, thereby preventing the parasitic capacitance produced by wiring. The degradation of the filter characteristics or the resonance characteristics of the boundary acoustic wave device thus can be prevented. Parasitic capacitance reduces the attenuation or reduces the bandwidth of filters or resonators disadvantageously.

If the wiring electrode 52 is disposed in a different layer from the layer of the IDT 3, as described above, the connection between these layers is preferably established by the through-hole electrodes 53 and 54. Boundary acoustic waves propagate through the region having the IDT 3 while slightly leaking from the electrode. If the through-hole electrodes 53 and 54, particularly through-hole electrode 54, are hollow, the difference in acoustic impedance between the hollow and the medium layer 6 becomes large, and accordingly the reflection coefficient in the through hole increases. Consequently, boundary acoustic waves can reflect, scatter, or resonate depending on the position of the through-hole electrode 54, and spurious responses and attenuation can be reduced disadvantageously. Accordingly, it is preferable that the through-hole electrode 54 be filled with an elastic material so that the above-mentioned difference in acoustic impedance can be reduced. Preferably, the through-hole electrode 53 is filled with an elastic material as well.

The IDT 3, which is generally formed by photolithography, may produce a problem by resist coating or wafer vacuum suction if the through-hole electrode 54 is hollow. In view of the prevention of these problems, the hollows of the through-hole electrodes 53 and 54 are preferably filled with an elastic material. If an electrically conductive material, such as Cu, is used as the elastic material, the wiring resistance can be advantageously reduced.

Through-hole electrodes 53 and 54 filled with no elastic material easily allow gases to flow into the depths of the boundary acoustic wave device from the outside, and consequently, the characteristics of the device may be degraded by a corrosive gas. Even in through-hole electrodes 53 and 54 sufficiently filled with an elastic material, the difference in thermal expansion or elasticity between the elastic material and the second medium layer 6 or other layers of the boundary acoustic wave device produces a stress, so that cracks easily occur. Thus, the device can be vulnerable to the penetration of corrosive gas from the outside. In particular, if some of the layers of the boundary acoustic wave device are formed of an amorphous material such as SiO$_2$ or a polycrystalline material such as ZnO, cracks as described above cause corrosive gas to penetrate the layers, so that the electrode may be corroded.

Figure 21:
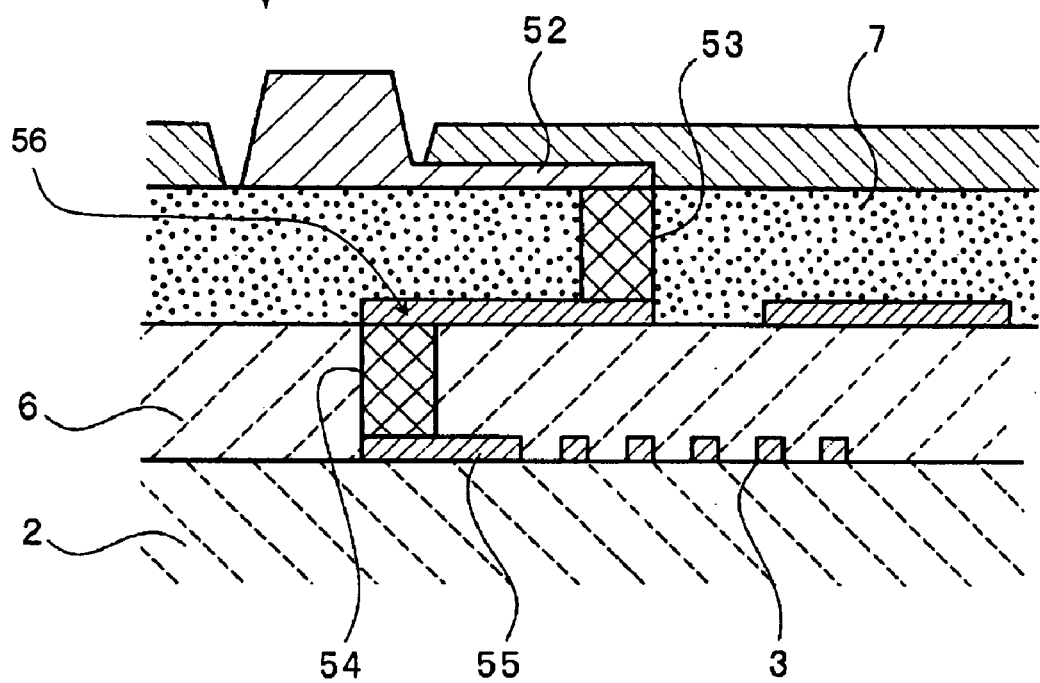
FIG. 21 is a fragmentary front sectional view of a boundary acoustic wave device according to another preferred embodiment of the present invention.

In the structure having a plurality of through-hole electrodes 53 and 54, as described above, it is preferable that the through-hole electrodes 53 and 54 not be continued in the thickness direction in the boundary acoustic wave device, as shown in FIG. 21. In FIG. 21, the through-hole electrodes 53 and 54 are disposed at different positions when viewed from above, and they are connected to each other with the connection electrode 56. Thus, the penetration of corrosive gas into the depths of boundary acoustic wave device can be prevented.

The interlaminar wiring using the through-hole electrodes can reduce the chip size of the boundary acoustic wave device because of its high degree of freedom of wiring. If a single crystal material is used for the first or the second medium layer or other layers of the boundary acoustic wave device, however, it is difficult to form through holes. For example, if the medium layers of the boundary acoustic wave device have large thicknesses, it is difficult to ensure vertical positions of the walls of the through holes or it takes a long time to form the through holes. The through holes are generally formed by reactive ion etching with a mixture of Ar and CF$_4$ gases. In addition, the formation of the holes may degrade the strength of the medium layers, or the changes in temperature during mounting on a circuit board or in ambient temperature may cause the chips to crack. Furthermore, boundary acoustic waves may be reflected or scattered at some portions of the through holes, or a corrosive gas may cause a problem. These problems can be solved by use of the wiring electrode disposed on the external surface of the boundary acoustic wave device, instead of use of the through-hole electrodes.

Figure 22:
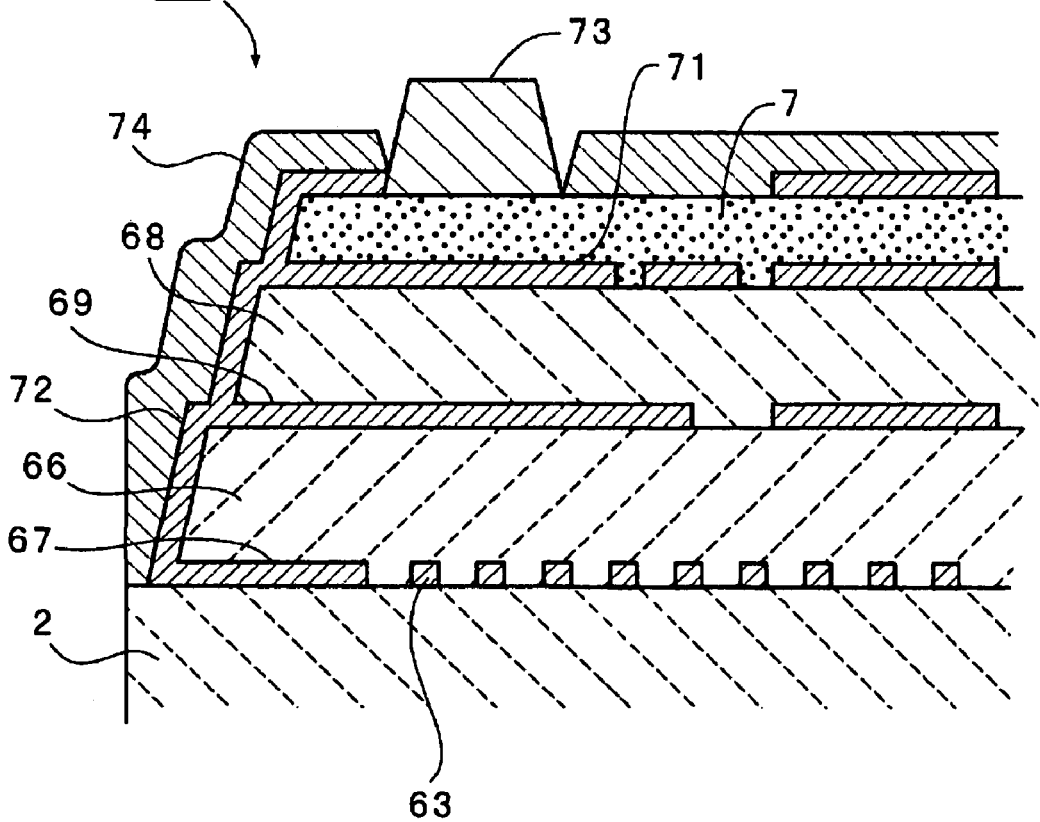
FIG. 22 is a fragmentary front sectional view of a boundary acoustic wave device according to another preferred embodiment of the present invention.

FIG. 22 is a schematic fragmentary sectional view of a boundary acoustic wave device having a wiring electrode at its external surface, according to a modification.

The boundary acoustic wave device 61 includes an IDT 63 and reflectors (not shown) on a first medium layer 2. The IDT 63 and the reflectors are covered with a second medium layer 66. A connection electrode 67 is disposed between the first medium layer 2 and the second medium layer 66, and is connected to the IDT 63. The connection electrode 67 is extended to the external surface of the boundary acoustic wave device 61. The second medium layer 66 is provided with a third medium layer 68 on its surface. Another wiring electrode 69 is provided between the second medium layer 66 and the third medium layer 68. The wiring electrode 69 is also extended to the external side surface of the boundary acoustic wave device 61.

The first and second medium layers 2 and 66 are provided in the same manner as the first and second medium layers 2 and 6 of the boundary acoustic wave device according to the first preferred embodiment. The third medium layer 68 is preferably formed of the same material as the second medium layer 66. Specifically, in the present preferred embodiment, the multilayer structure including the second medium layer 66 and the third medium layer 68 defines the upper medium layer overlying the interface. The third medium layer 68 however may be formed of a different material than the second medium layer 66.

A sound absorbing layer 7 is provided on the upper surface of the third medium layer 68. The sound absorbing layer 7 is made of the same material as the sound absorbing layer 7 in the first preferred embodiment.

A wiring electrode 71 is provided between the third medium layer 68 and the sound absorbing layer 7. The wiring electrode 71 is also extended to the external surface of the boundary acoustic wave device 61.

The external side surface of the boundary acoustic wave device 61 is provided with another wiring electrode 72. The wiring electrode 72 electrically connects the connection electrode 67 and the wiring electrodes 69 and 71 on the external surface of the boundary acoustic wave device 61.

In addition, the boundary acoustic wave device 61 has an external connection electrode 73 on the upper surface of the sound absorbing layer 7, and the wiring electrode 72 is connected to the external connection electrode 73. Further, in the boundary acoustic wave device 61, the external surface of the multilayer structure including the second medium layer 66, the third medium layer 68, and the sound absorbing layer 7, other than the region having the external connection electrode 73 is covered with a protective film 74. The protective film 74 is appropriately made of an insulating resin, such as an epoxy resin. By providing the protective film 74, the environmental characteristics of the boundary acoustic wave device 61, such as moisture resistance, can be enhanced.

Figure 23:
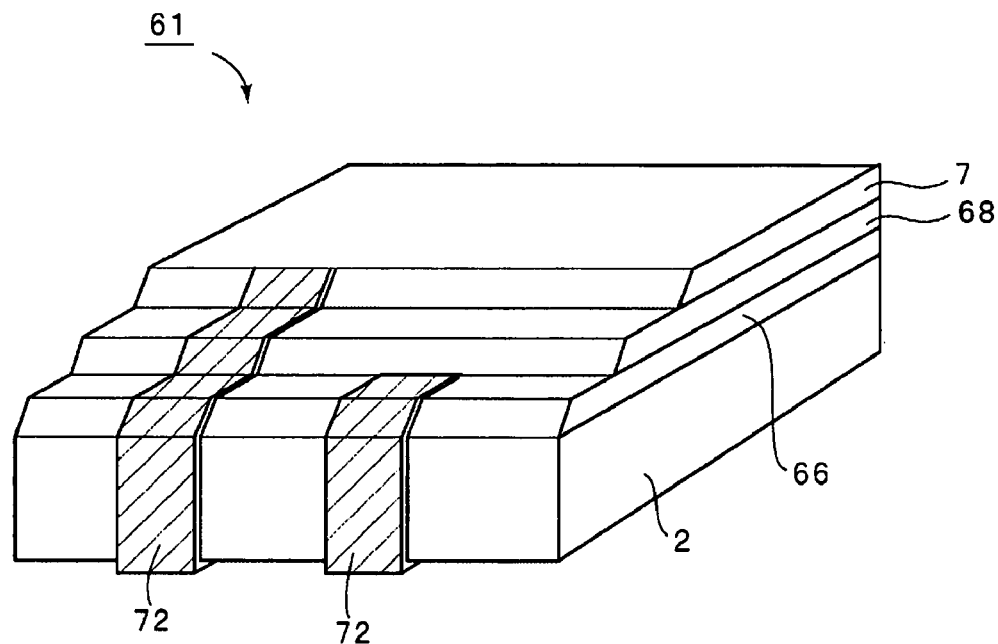
FIG. 23 is a perspective view of the principal parts of the boundary acoustic wave device shown in FIG. 22.

FIG. 23 is a perspective view of the boundary acoustic wave device 61 shown in FIG. 22, from which the protective film 74 and the external connection electrode 73 are omitted. As clearly shown in FIGS. 22 and 23, in the boundary acoustic wave device 61, the second medium layer 66, the third medium layer 68, and the sound absorbing layer 7 are stacked in such a manner that their external side surfaces having the wiring electrode 72 form steps. In other words, the regions of the external side surfaces having the wiring electrode 72 of the second medium layer 66, the third medium layer 68, and the sound absorbing layer 7 are gradually shifted toward the middle in that order. The connection electrode 67 and the wires 69 and 71 are extended to the steps. Thus, the wiring electrode 72 is electrically connected to the connection electrode 67 and the wires 69 and 71 at large areas with reliability.

In the manufacturing of the boundary acoustic wave device 61 having the steps, many boundary acoustic wave devices 61 are formed on a mother wafer, subsequently external connection electrodes 73 are formed preferably simultaneously by photolithography, screen printing, or plating, and then the wiring electrodes 72 are provided. Finally, the mother wafer is cut into individual boundary acoustic wave devices 61. Thus, the wiring between the layers can be efficiently formed at a low cost.

Figure 24:
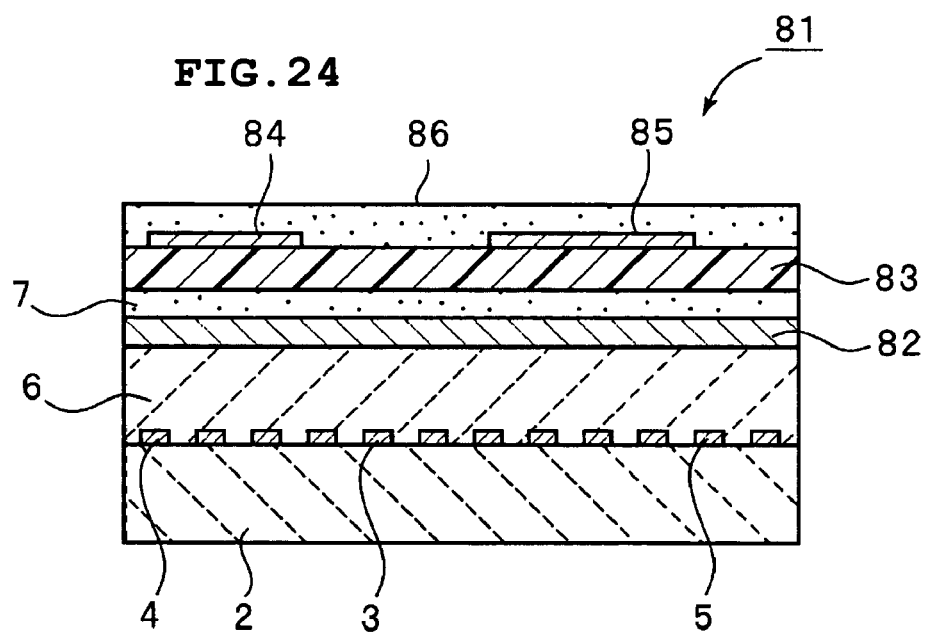
FIG. 24 is a front sectional view of a boundary acoustic wave device according to another preferred embodiment of the present invention.

FIG. 24 is a schematic front sectional view of a boundary acoustic wave device according to another preferred embodiment of the present invention. The boundary acoustic wave device 81 of this preferred embodiment has an IDT 3 and reflectors 4 and 5 on a LiNbO$_3$ first medium layer 2. The electrode structure including the IDT 3 and the reflectors 4 and 5 is covered with a second medium layer 6. The second medium layer 6 is preferably made of a SiO$_2$ film.

The second medium layer 6 is provided with a thermally conductive material layer 82 having a lower linear expansion coefficient and a higher thermal conductivity than the LiNbO$_3$ substrate, on its upper surface. The thermally conductive material layer 82 in the present preferred embodiment is made of a diamond-like carbon thin film. A sound absorbing layer 7 is provided on the upper surface of the thermally conductive material layer 82. The sound absorbing layer 7 is preferably made of the same material as the sound absorbing layer 7 in the first preferred embodiment.

Further, an epoxy resin layer 83 is provided on the upper surface of the sound absorbing layer 7. The epoxy resin layer 83 is provided with wiring electrodes 84 and 85 on its upper surface. The wiring electrodes 84 and 85 are covered with a protective film 86. The epoxy resin layer 83, the wiring electrodes 84 and 85, and the protective film 86 are provided for disposing a wiring circuit on the upper side of the boundary acoustic wave device 81.

The protective film 86 is made of the same material as the protective film 74, such as an epoxy resin, and is intended to enhance the moisture resistance of the upper portion of the boundary acoustic wave device 81.

In the boundary acoustic wave device 81 of the present preferred embodiment, the thermally conductive material layer 82 on the upper surface of the second medium layer 6 facilitates heat dissipation and prevents a temperature increase when high power is applied. Thus, the electrical power resistance of the boundary acoustic wave device can be enhanced.

In addition, the sound absorbing layer 7 suppresses undesired spurious responses effectively, as in the boundary acoustic wave device of the first preferred embodiment of the present invention.

The thermally conductive material layer 82 can be formed of an appropriate material having a lower thermal expansion coefficient and a higher thermal conductivity than the material of the first medium layer 2, as mentioned above.

The variation of the characteristics by temperature changes of the boundary acoustic wave device of the present preferred embodiment depends on the variations per unit temperature in acoustic velocity and in length in the propagation direction of the substrate. If the expansion and contraction of the substrate depending on temperature is reduced, frequency variation by temperature changes can be reduced. Accordingly, a linear expansion coefficient material layer having a lower linear expansion coefficient than the first medium layer of the boundary acoustic wave propagating substrate can be disposed between the first and the second medium layer, or on the surface of the first or the second medium layer. Thus, the expansion and contraction of the first and/or the second medium layer can be reduced and the variation of the characteristics resulting from temperature changes can be reduced. The above-mentioned diamond-like carbon is an example of the materials capable of forming the low linear expansion coefficient material layer.

Also, by reducing the thermal expansion in the direction parallel to the interface in the boundary acoustic wave device, stresses resulting from a difference in the thermal expansion coefficient produced when the device is mounted on a ceramic mounting board having a low thermal expansion coefficient can be reduced and, consequently, breakage caused by the stress can be prevented. Even if a layer having a linear expansion coefficient with an opposite polarity to that of the first and second medium layers is disposed on the surface of the first and/or the second medium layer, the boundary acoustic wave device and the mounted structure can be prevented from breaking by eliminating the stress resulting from the difference in thermal expansion coefficient.

Specifically, by replacing the thermally conductive material layer 82 shown in FIG. 24 with the above low linear expansion coefficient or a material layer having a linear expansion coefficient with an opposite polarity, the mounted structure after mounting can be prevented from being broken by temperature changes.

The wiring circuit of the boundary acoustic wave device 81 shown in FIG. 24 includes the wiring electrodes 84 and 85. In this instance, the wiring circuit including the wiring electrodes 84 and 85 may further include, for example an inductance element, a capacitance element, a resistance element, a stripline, and a microstrip filter or mixer including a stub and a stripline. Thus, by providing various types of electrodes or circuit elements on the upper surface of the epoxy resin layer 83, a boundary acoustic wave device 81 containing a variety of circuits, such as a matching circuit, can be achieved. The structure containing such circuits allows the omission of external circuits, such as impedance matching circuits and modulation circuits.

The circuit including the wiring electrodes 84 and 85 is not, however, necessarily provided on the upper surface of the epoxy resin layer 83. For example, it may be disposed on the surface of the second medium layer 6 opposite the interface, or on at least either surface of the sound absorbing layer 7. Specifically, even if the boundary acoustic wave device does not have the epoxy resin layer 83 or the protective film 86, it can contain various types of circuits as in the boundary acoustic wave device 81 shown in FIG. 24.

A boundary acoustic wave device 81 having a wire bonding or a bump bond often has lines of several tens to several hundreds of micrometers outside. In general, the characteristic impedance of these lines differs from the input and output impedances of the boundary acoustic wave device. Accordingly, impedance mismatching is likely to cause reflection loss or other deterioration. The circuit including the wiring electrodes 84 and 85 inside the boundary acoustic wave device allows the omission of the long lines to reduce the reflection loss. In particular, characteristics can be improved in the frequency band of higher than 1 GHz by reducing the length of the lines.

The wiring electrodes, circuit element, or external connection electrode may be stacked together with the IDT or the reflector in the thickness direction. Thus, the area of the boundary acoustic wave device chip can be reduced.

Since in the boundary acoustic wave device of the present preferred embodiment, boundary acoustic waves propagate along the interface between the first and the second medium layer, the propagation characteristics are hardly degraded even if the device is not packaged in a case. Accordingly, the boundary acoustic wave device is not necessarily packaged for short-term use.

For long-term use in, for example, cellular phones, however, the external surface of the boundary acoustic wave device is preferably covered with, for example, the protective film 74 shown in FIG. 22. The protective film 74 is intended to enhance the environmental resistance and moisture resistance. It is therefore preferable that the protective film be arranged so as to cover the electrodes easily affected by corrosion, such as the IDT and the reflectors, and regions that are easily cracked, such as those around through holes. The protective film 74 can prevent the corrosion of the $SiO_2$ film forming the sound absorbing layer or the corrosion of the electrode by corrosive gases, or enhance the moisture resistance.

The protective film may be formed of, for example, a multilayer composite of a metal and a resin, a synthetic resin layer, and a metal material layer. For example, the protective film can be formed by depositing a metal material layer, such as an Au layer, a Ni layer, and an Al alloy layer, or a Au/Ni/AlN, AlN, or $Al_2O_3$ layer, and then covering the metal material layer with a synthetic resin.

Alternatively, the protective film may be formed by depositing a metal material layer by a thick film forming method and then depositing a synthetic resin on the metal material layer.

Figure 25:
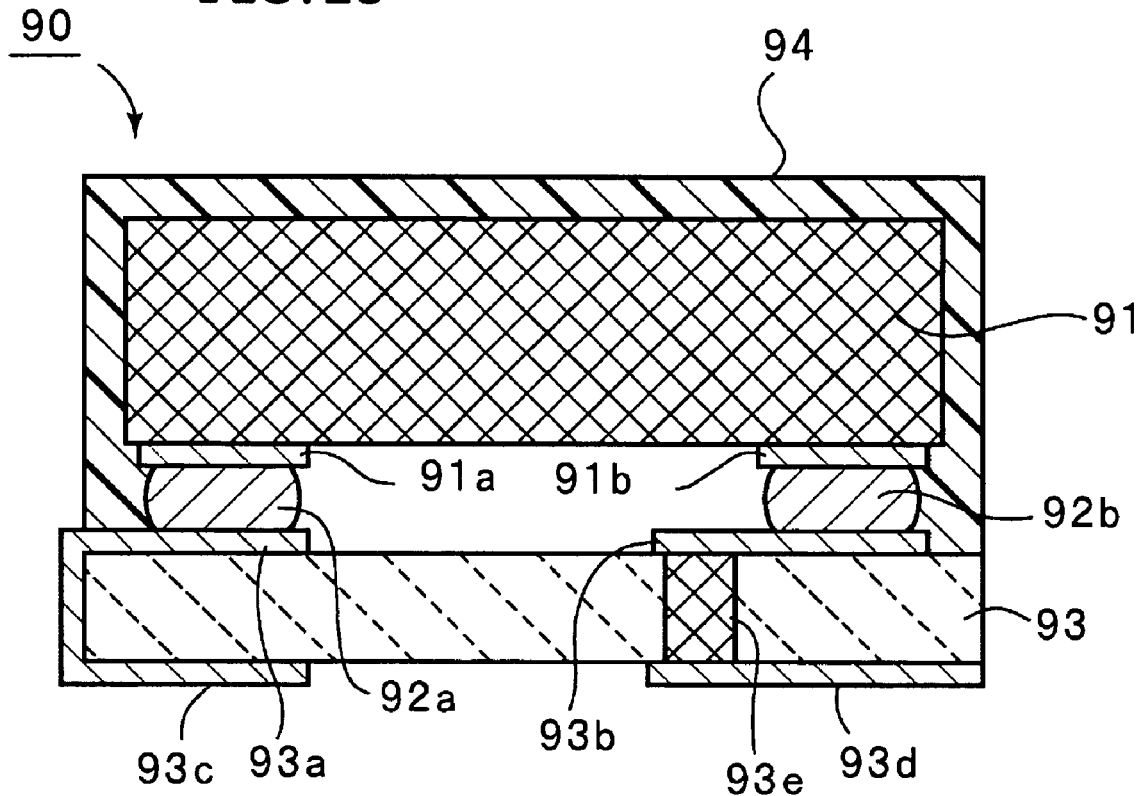
FIG. 25 is a front sectional view of a boundary acoustic wave device according to another preferred embodiment of the present invention.

FIG. 25 is a front sectional view of a boundary acoustic wave device according to another preferred embodiment of the present invention. The boundary acoustic wave device 90 has electrodes 91a and 91b on the lower surface of a boundary acoustic wave device chip 91. The boundary acoustic wave device chip 91 preferably has the same structure as the above-described surface acoustic wave devices, but is simply indicated by hatching in FIG. 25.

The electrodes 91a and 91b are bonded to electrodes 93a and 93b on a ceramic substrate 93 with Au bumps 92a and 92b, respectively. The bumps 92a and 92b are bonded onto the electrodes 91a and 91b by ultrasonic bonding. After bonding the bumps 92a and 92b, a resin protective film 94 covers the boundary acoustic wave device chip 91. The protective film 94 may be provided after the mounting of the boundary acoustic wave device chip 91 on the ceramic substrate 93, as described above. In this instance, the protective film 94 is expected to reduce the stress placed on the boundary acoustic wave device chip by the ceramic substrate 93.

The ceramic substrate 93 is made of a material that is harder than the boundary acoustic wave device chip 91. More specifically, it is made of a material harder than the multilayer composite including the medium layers and the dielectric layer of the boundary acoustic wave device chip 91. The electrodes 93a and 93b are electrically connected to terminals 93c and 93d provided on the bottom surface. The electrode 93a is extended to the bottom surface through the side surface of the substrate 93 and electrically connected to the external terminal 93c on the bottom surface. The other electrode 93b is connected to the other external terminal 93d on the bottom surface with a through-hole electrode 93e. The connection between the external terminal on the bottom surface of the substrate 93 and the electrode on the upper surface may be established with a through-hole electrode.

In the boundary acoustic wave device 90 of the present preferred embodiment, the boundary acoustic wave device chip 91 is joined to the ceramic substrate 93 with the Au bumps 92a and 92b.

Thus, the boundary acoustic wave device 90 can be surface-mounted on a printed circuit board or the like with the external terminals 93c and 93d. In this instance, even if the printed circuit board is warped by temperature changes, the ceramic substrate 93 stops the stress from the printed circuit board, consequently preventing the stress from being transmitted to the boundary acoustic wave device chip 91. Thus, in the boundary acoustic wave device chip 91, the frequency characteristics are not easily degraded, and the chip is not easily cracked.

The electrodes 91a and 91b may be made of an appropriate metal, such as Au, Ni, or Al, or a composite composed of electrode layers of these metals.

Figure 26:
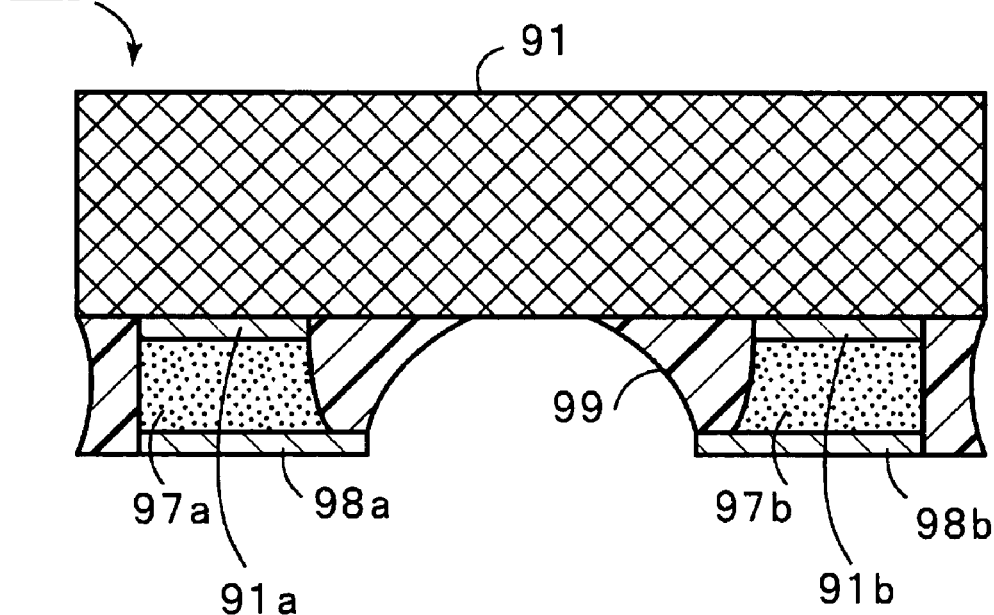
FIG. 26 is a front sectional view of a boundary acoustic wave device according to another preferred embodiment of the present invention.

FIG. 26 is a front sectional view of a boundary acoustic wave device according to another preferred embodiment of the present invention. This boundary acoustic wave device 96 has electrodes 91a and 91b on the lower surface of the boundary acoustic wave device chip 91. This structure is the same as that of the boundary acoustic wave device 90. However, the boundary acoustic wave device 96 is different in that external terminals 98a and 98b are bonded to the electrodes 91a and 91b on the lower surface of the boundary acoustic wave device chip 91 through portions 97a and 97b of a conductive paste, and in that a reinforcing resin layer 99 is provided around the portions 97a and 97b of the conductive paste.

The conductive paste of the portions 97a and 97b preferably includes a resin adhesive and conductive powder, and is relatively soft even after being cured. Accordingly, when the device is mounted on a printed circuit board using the external terminals 98a and 98b, stress from the printed circuit board is reduced by the conductive paste portions 97a and 97b. Specifically, the conductive paste portions 97a and 97b function as stress absorbers. Consequently, the characteristic degradation and cracks of the boundary acoustic wave device chip 91 do not easily occur.

If the conductive paste portions 97a and 97b are relatively soft, a reinforcing resin layer 99 shown in FIG. 26 is preferably provided. If the conductive paste portions 97a and 97b are sufficiently hard and can reduce the stress, the reinforcing resin layer 99 is not necessarily required. The reinforcing resin layer 99 is preferably made of, for example, an epoxy resin adhesive.

In the boundary acoustic wave device of a present preferred embodiment, since boundary acoustic waves propagate along the interface between the first and the second medium layer, the boundary waves have almost no modes in which waves reach the surface of the chip. Therefore, the package for the boundary acoustic wave device is not required to have a recess or a hole. Specifically, packages for general boundary acoustic wave devices or piezoelectric filters are required to have a recess or a hole for preventing interference with vibration. However, the boundary acoustic wave device of the present preferred embodiments does not require any recess or hole even if it is packaged. Consequently, the size can be reduced even if packaging is applied.

FIGS. 27A to 27G are front sectional views illustrating a method for manufacturing a boundary acoustic wave device.

In the present preferred embodiment, first, a mother wafer 101 is prepared. The wafer 101, which is made of about a 3 to 4 inch $LiNbO_3$ substrate, is prepared for forming a first medium layer.

An electrode structure including an IDT 102, reflectors 103 and 104, and wiring electrodes 105 and 106 is provided on the upper surface of the wafer 101 by an appropriate method, such as a photolithography lift-off method.

As shown in FIG. 27B, a second medium layer 107 is arranged so as to cover the electrode structure. The second medium layer 107 in the present preferred embodiment is formed of a $SiO_2$ thin film by sputtering.

Turning then to FIG. 27C, the second medium layer 107 is etched to expose the wiring electrodes 105 and 106 so as to be external connecting portions.

Then, a connection electrode 108 is formed so as to be electrically connected to the wiring electrode 106, as shown in FIG. 27D. The connection electrode 108 extends to the upper surface 107a of the second medium layer 107.

Then, a sound absorbing layer 109 is formed by spin coating of a photosensitive resin. The upper surface of the sound absorbing layer 109 is covered with a SiN layer 110 serving as a protective film by sputtering.

Turning then to FIG. 27E, openings 111 and 112 are formed to expose the wiring and connection electrodes 105 and 108, respectively, by photolithography etching. External terminals 113 and 114 are formed inside the openings 111 and 112 by screen printing. The external terminals 113 and 114 are electrically connected to the wiring electrode 105 and the connection electrode 108, respectively.

Thus, many boundary acoustic wave devices having the external terminals 113 and 114 are formed on the mother wafer 101, as shown in FIG. 27F. The mother wafer 101 is then cut as shown in FIG. 27G, and thus many boundary acoustic wave devices 115 are manufactured.

The manufacturing method according to the present preferred embodiment forms the sound absorbing layers 109 simultaneously while in the stage of the mother wafer 101. Consequently, variation among the sound absorbing layers 109 of many boundary acoustic wave devices 115 can be reduced. In addition, since the sound absorbing layer 109 is made of a photosensitive resin, the pattern of the sound absorbing layers 109 can be easily formed with high precision. Furthermore, the SiN layer 110 as a protective film facilitates the achievement of a moisture-resistant boundary acoustic wave device.

FIGS. 28A to 28F are front sectional views illustrating a method for manufacturing a boundary acoustic wave device according to another preferred embodiment of the present invention.

Figure 27:
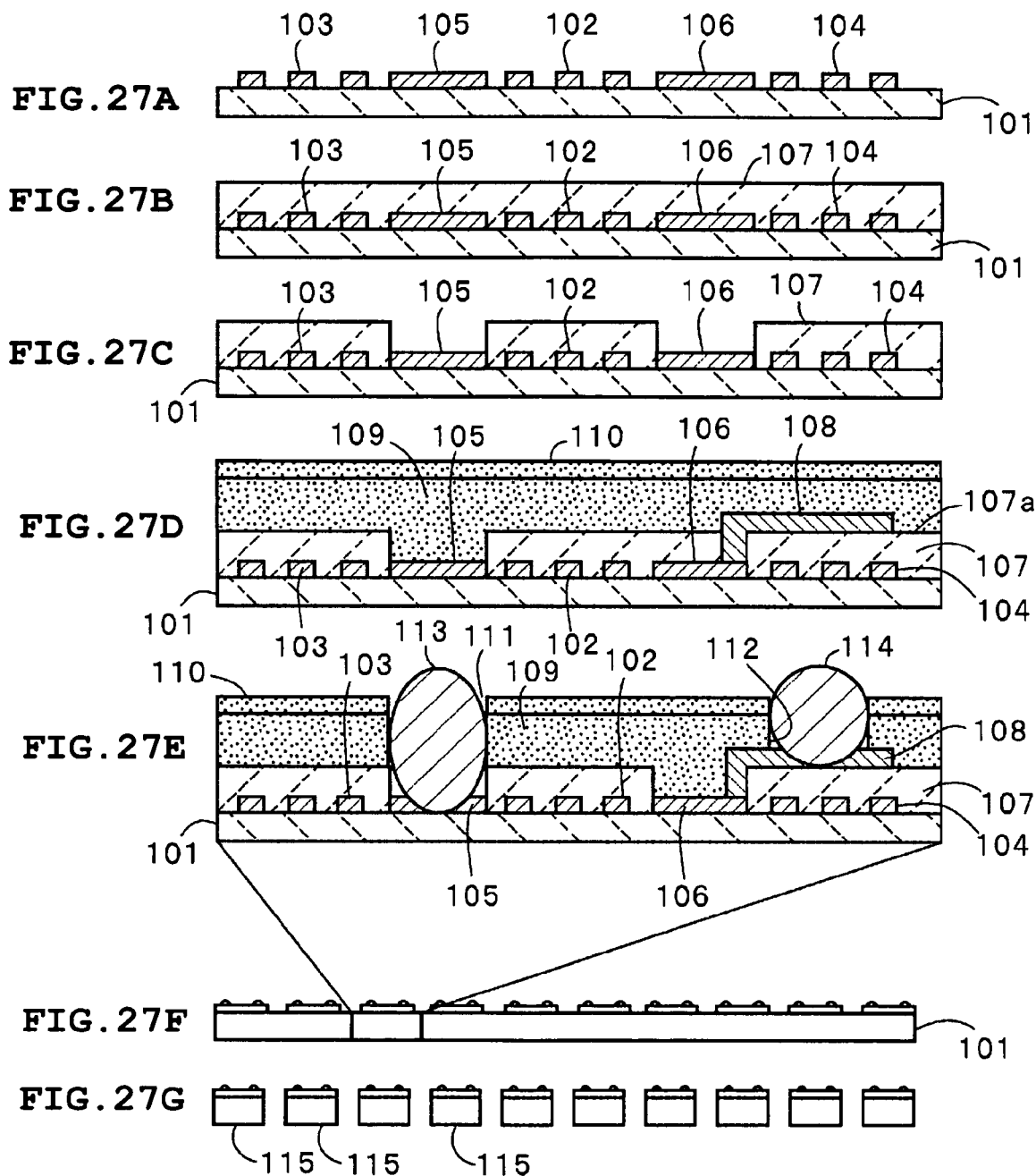
FIGS. 27A to 27G are front sectional views illustrating a method for manufacturing a boundary acoustic wave device according to a preferred embodiment of the present invention.
Figure 28:
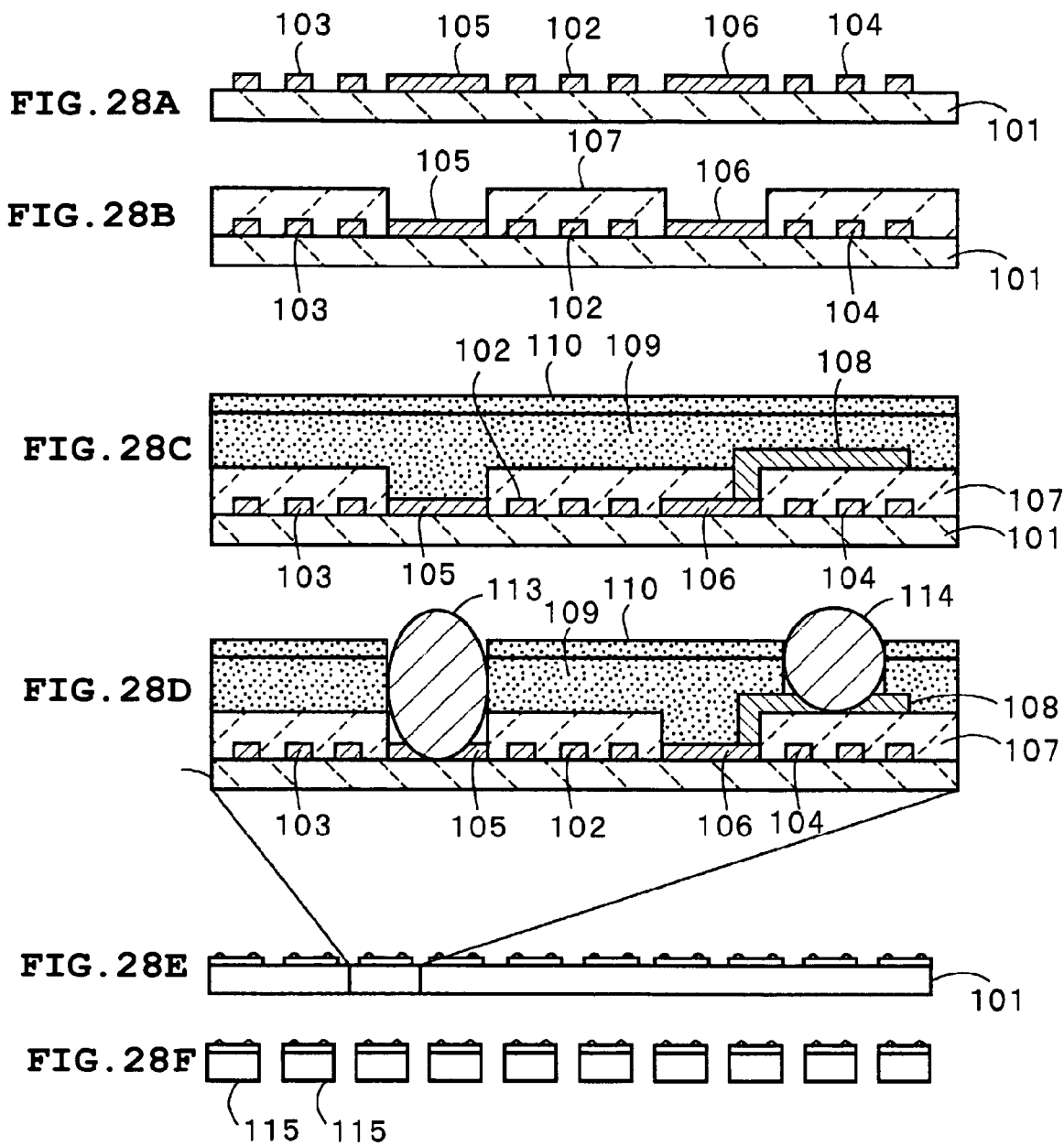
FIGS. 28A to 28F are front sectional views illustrating a method for manufacturing a boundary acoustic wave device according to another preferred embodiment of the present invention.

The method of the present preferred embodiment is the same as the manufacturing method shown in FIG. 27, except for the step of formatting a second medium layer 107. Specifically, as shown in FIG. 28A, an electrode structure is formed on a wafer 101 in the same manner as in FIG. 27A, and then, a thin film forming the second medium layer 107 is deposited over the wafer 101 so that sputtering particles mask the electrode structure except the regions where external terminals are provided. Thus, the second medium layer 107 is patterned so as to have openings corresponding to the openings 111 and 112 (FIG. 27E).

The following steps shown in FIGS. 28C to 28E are performed in the same manner as the steps shown in FIGS. 27D to 27G.

The present preferred embodiment facilitates the formation of the second medium layer 107 having openings where the external terminals are provided with high precision, as described above, even if the second medium layer 107 is formed of a material difficult to remove by etching.

FIGS. 29A to 29H are front sectional views illustrating a method for manufacturing a boundary acoustic wave device according to another preferred embodiment of the present invention.

Figure 29:
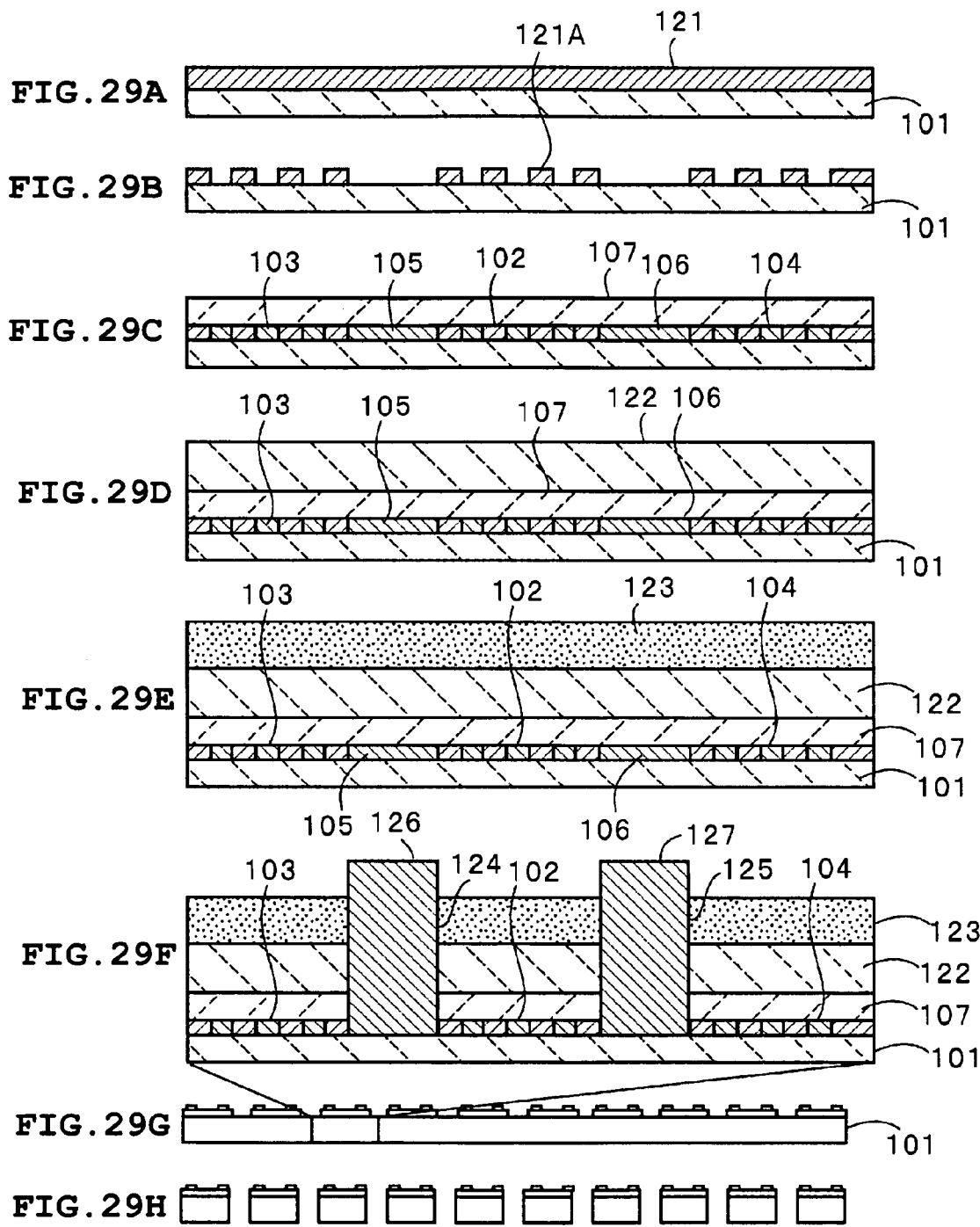
FIGS. 29A to 29H are front sectional views illustrating a method for manufacturing a boundary acoustic wave device according to another preferred embodiment of the present invention.

In the present preferred embodiment, a fourth medium layer 121 is formed on a mother wafer 101 (FIG. 29A). Then, the fourth medium layer 121 is patterned. As shown in FIG. 29B, in the patterned fourth medium layer 121A, the regions where an electrode structure described below is formed are defined as openings.

Turning then to FIG. 29C, the electrode structure is formed to a thickness slightly smaller or equal to the depth of the openings by photolithography. The electrode structure includes an IDT 102, reflectors 103 and 104, and wiring electrodes 105 and 106.

Turning then to FIG. 29C, a second medium layer 107 is formed. In the present preferred embodiment, the second medium layer is preferably made of the same material as the fourth medium layer. However, it may be formed of another material.

Then, a third medium layer 122 is formed on the second medium layer 107, as shown in FIG. 29D. Turning then to FIG. 29E, a sound absorbing layer 123 is formed on the third medium layer 122.

The third medium layer 122 is made of a Si single crystal substrate, and the substrate is bonded to the second medium layer 107 to form the structure shown in FIG. 29D.

Then, a sound absorbing layer 123 made of a photosensitive resin is etched by photolithography to form openings 124 and 125 shown in FIG. 29F. The openings expose the wiring electrodes 105 and 106. Then, external terminals 126 and 127 are formed in the openings 124 and 125. Then, the mother wafer 101 having many boundary acoustic wave devices is cut as shown in FIG. 29G to separate the boundary acoustic wave devices as shown in FIG. 29H.

FIGS. 30A to 30F are sectional views illustrating a method for manufacturing a boundary acoustic wave device according to another preferred embodiment of the present invention.

Figure 30:
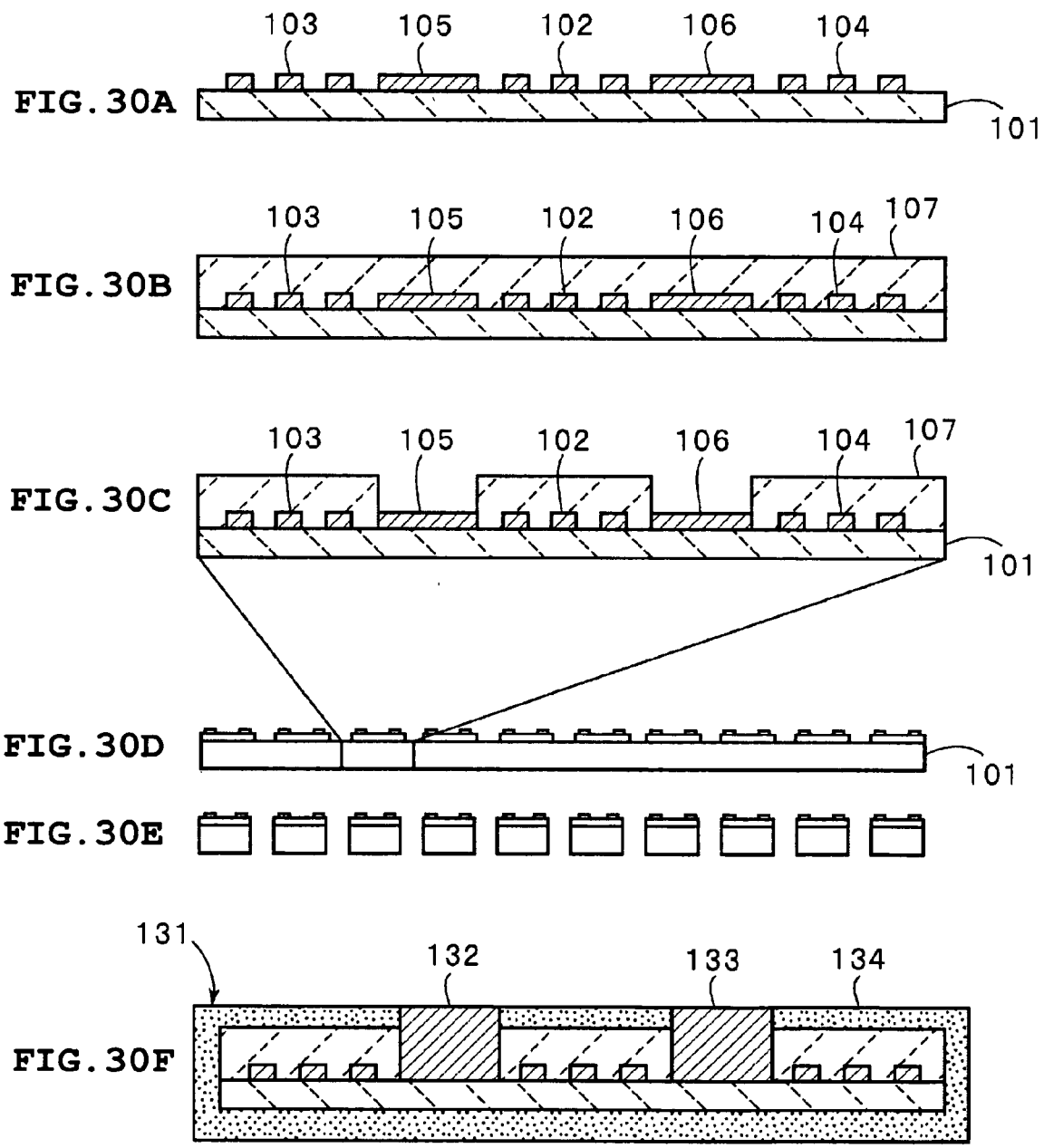
FIGS. 30A to 30F are front sectional views illustrating a method for manufacturing a boundary acoustic wave device according to another preferred embodiment of the present invention.

In the present preferred embodiment, the same steps as shown in FIGS. 27A to 27C are performed as shown in FIGS. 30A to 30C, thus forming IDTs 102, reflectors 103 and 104, wiring electrodes 105 and 106, and patterned second medium layer 107, for a plurality of boundary acoustic wave devices on a mother wafer 101.

In the present preferred embodiment, after the patterning of the second medium layer 107 is finished, the mother wafer 101 is divided into boundary acoustic wave devices by dicing, as shown in FIG. 30D. Then, external terminals 132 and 133 and a sound absorbing layer 134 are provided on each boundary acoustic wave chip, thus producing the boundary acoustic wave device 131 shown in FIG. 30F. The sound absorbing layer 134 in the present preferred embodiment is preferably made of an epoxy resin whose composition is adjusted so that the acoustic velocity of transverse waves is lower than that of transverse waves in the second medium layer, and is formed so as to cover all the boundary acoustic wave devices except the exposed portions of the external terminals 132 and 133. The sound absorbing layer 134 is thus formed by resin molding.

The step of forming the sound absorbing layer may be performed after dividing the mother wafer into boundary acoustic wave devices as above. Also, the sound absorbing layer may be molded to the region except the external connection terminals. Thus, the environmental resistance of the boundary acoustic wave device can be enhanced.

Figure 31:
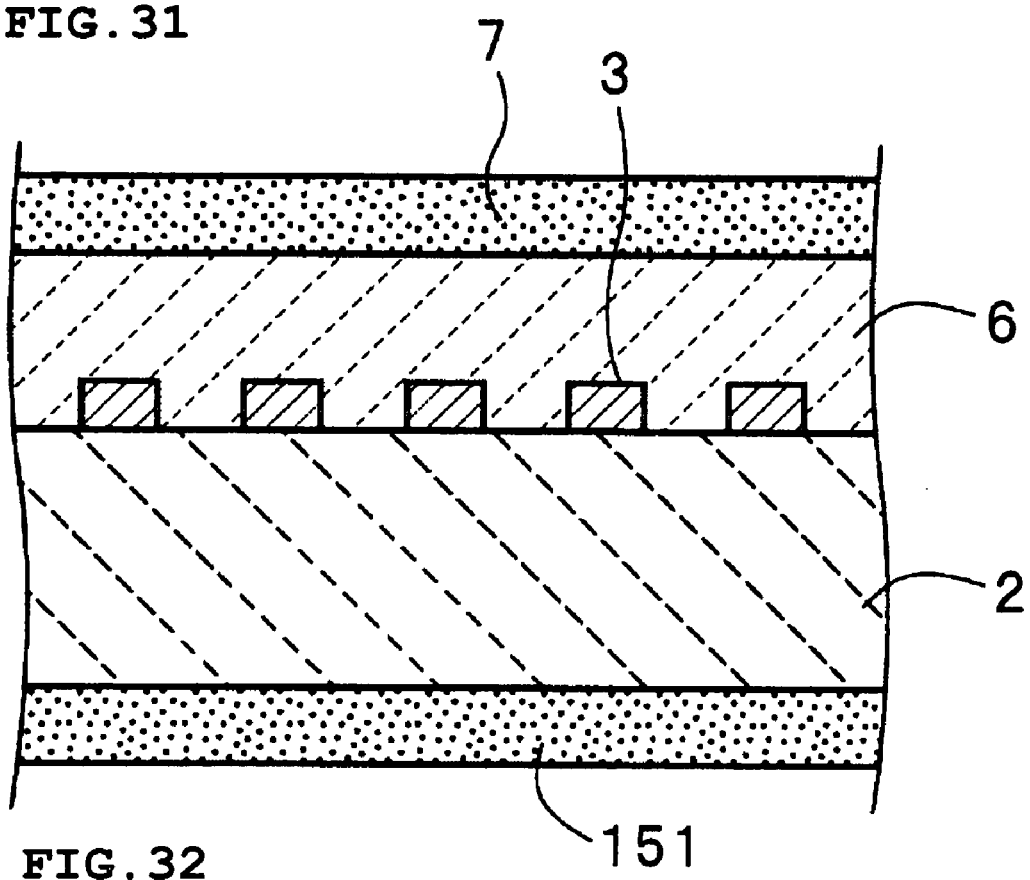
FIG. 31 is a fragmentary sectional view illustrating a method for manufacturing a boundary acoustic wave device according to another preferred embodiment of the present invention.
Figure 32:
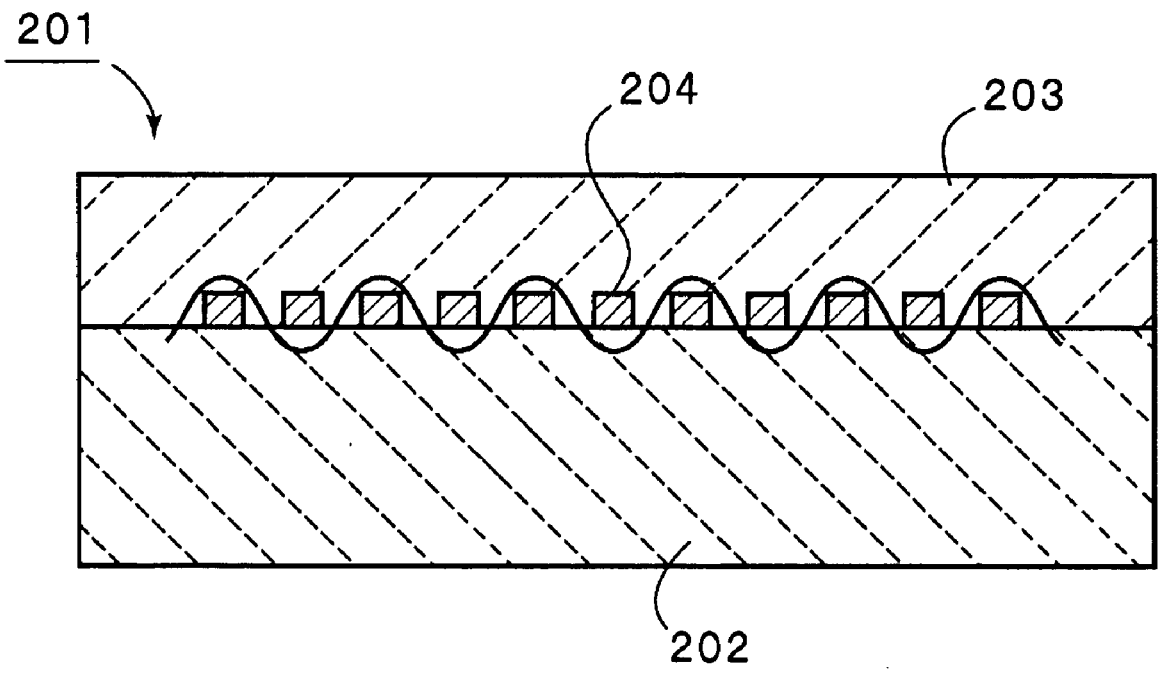
FIG. 32 is a front sectional view of a known boundary acoustic wave device.
Figure 33:
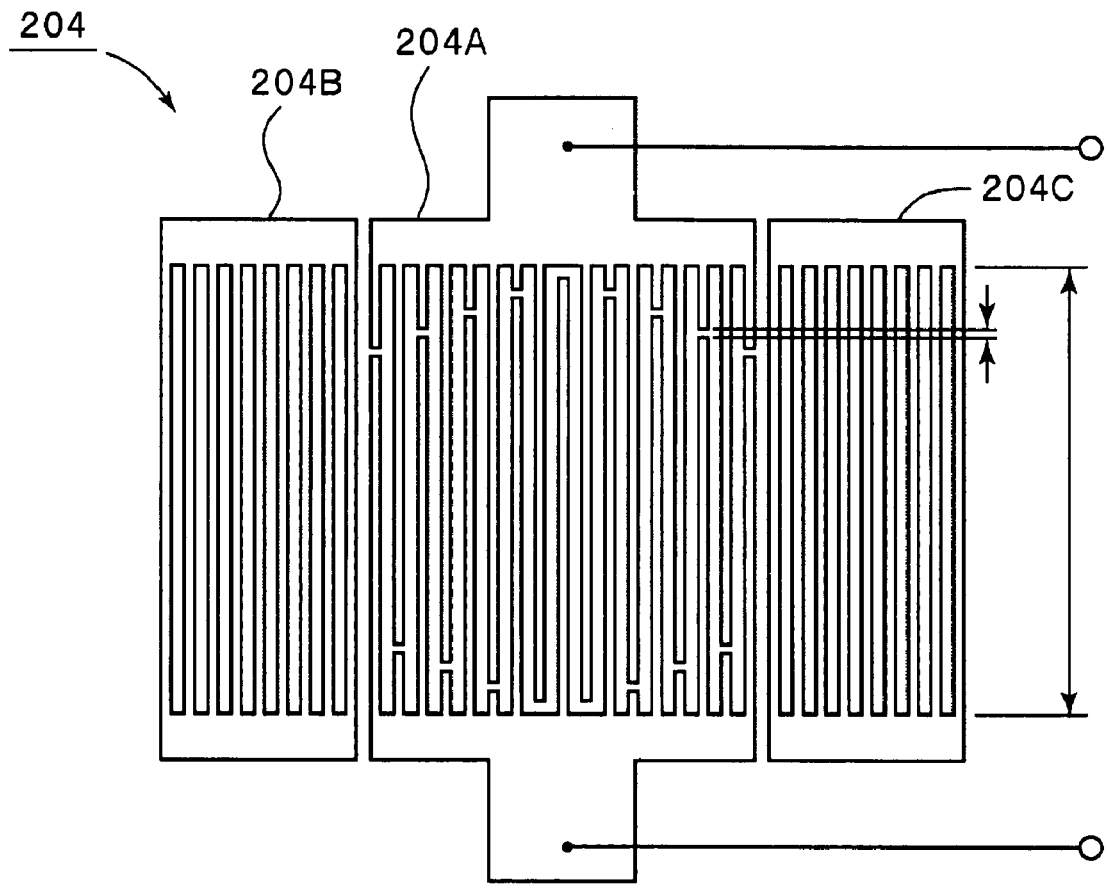
FIG. 33 is a schematic plane view of the electrode structure of a 1-port boundary acoustic wave resonator prepared as the known boundary acoustic wave device.

FIG. 31 is a front sectional view of a boundary acoustic wave device according to a modification of the preferred embodiments of the present invention.

In the boundary acoustic wave device shown in FIG. 31, a second sound absorbing layer 151 is provided on the lower surface of a first medium layer 2. This structure is the same as that of the boundary acoustic wave device 1 shown in FIG. 1. The sound absorbing layer may be provided not only on the opposite surface to the interface of the second medium layer, but also on the opposite surface to the interface of the first medium layer.

Alternatively, the sound absorbing layer may be provided only on the surface of the second medium layer, but not the surface of the first medium layer.

While the present invention has been described with respect to preferred embodiments thereof, it will be apparent to those skilled in the art that the disclosed invention may be modified in numerous ways and may assume many preferred embodiments other those specifically set out and described above. Accordingly, it is intended by the appended claims to cover all modifications of the present invention which fall within the true spirit and scope of the present invention.

The invention claimed is:

1. A boundary acoustic wave device comprising:
a first medium layer;
a second medium layer stacked on the first medium layer;
an electrode disposed in an interface between the first medium layer and the second medium layer, wherein boundary acoustic waves propagate along the interface between the first and second medium layers; and
a sound absorbing layer disposed on at least one of external surfaces of at least one of the first and second medium layers opposite to the interface so as to attenuate spurious responses.

2. The boundary acoustic wave device according to claim 1, wherein an acoustic velocity of transverse waves in the sound absorbing layer is lower than an acoustic velocity of transverse waves in at least one of the first medium layer and the second medium layer having the sound absorbing layer.

3. The boundary acoustic wave device according to claim 1, wherein an acoustic velocity of longitudinal waves in the sound absorbing layer is lower than an acoustic velocity of longitudinal waves in at least one of the first medium layer and the second medium layer having the sound absorbing layer.

4. The boundary acoustic wave device according to claim 1, wherein an acoustic velocity of transverse waves in the sound absorbing layer is in the range of about 0.13 to about 1.23 times an acoustic velocity of transverse waves in at least one of the first medium layer and the second medium layer having the sound absorbing layer.

5. The boundary acoustic wave device according to claim 1, wherein an acoustic impedance of the sound absorbing layer is in the range of about 0.20 to about 5.30 times an acoustic impedance of at least one of the first medium layer and the second medium layer having the sound absorbing layer.

6. The boundary acoustic wave device according to claim 1, wherein the sound absorbing layer comprises the same type of material as at least one of the first medium layer and the second medium layer.

7. The boundary acoustic wave device according to claim 1, further comprising a low attenuation constant layer external to the sound absorbing layer, the attenuation constant layer having a lower attenuation constant for acoustic waves than the sound absorbing layer.

8. The boundary acoustic wave device according to claim 1, wherein the sound absorbing layer comprises at least one material selected from the group consisting of resin, glass, ceramic, and metal.

9. The boundary acoustic wave device according to claim 8, wherein the sound absorbing layer comprises a resin including a filler.

10. The boundary acoustic wave device according to claim 1, wherein the sound absorbing layer is arranged on the surface of at least one of the first medium layer and the second medium layer so as to oppose a boundary acoustic wave propagation path in the interface.

11. The boundary acoustic wave device according to claim 1, further comprising an electrically conductive layer on at least one surface of the sound absorbing layer.

12. The boundary acoustic wave device according to claim 1, further comprising a through-hole electrode passing through at least one of the first medium layer and the second medium layer, the through-hole electrode being electrically connected to the electrode disposed in the interface, and an external electrode disposed on an external surface of the boundary acoustic wave device, the external electrode being connected to the through-hole electrode.

13. The boundary acoustic wave device according to claim 12, wherein the through-hole electrode is filled with an elastic material.

14. The boundary acoustic wave device according to claim 12, wherein the through-hole electrode is separately provided in the first medium layer and the second medium layer, and the through-hole electrode of the first medium layer and the through-hole electrode of the second medium layer are discontinuous to each other.

15. The boundary acoustic wave device according to claim 1, further comprising a wiring electrode provided on an external surface of the boundary acoustic wave device, the wiring electrode being electrically connected to the electrode disposed in the interface.

16. The boundary acoustic wave device according to claim 15, further comprising a connection electrode connected to the electrode disposed in the interface, wherein the boundary acoustic wave device includes steps on a side surface intersecting the interface and the connection electrode is extended to the steps, and wherein the wiring electrode is extended to the steps and connected to the connection electrode at the steps.

17. The boundary acoustic wave device according to claim 1, further comprising a third material layer in at least one of regions between the first medium layer and the second medium layer, on the outer surface of the first medium layer, and on the outer surface of the second medium layer, and the third material layer having a lower linear expansion coefficient in a direction that is substantially parallel to the interface than the first and the second medium layer.

18. The boundary acoustic wave device according to claim 1, further comprising a third material layer in at least one of regions between the first medium layer and the second medium layer, on the outer surface of the first medium layer, and on the outer surface of the second medium layer, and the third material layer having a linear expansion coefficient in a direction that is substantially parallel to the interface, with a sign opposite to that of the first and the second medium layer.

19. The boundary acoustic wave device according to claim 17, further comprising a fourth material layer in at least one of regions between the first medium layer and the second medium layer, on the outer surface of the first medium layer, and on the outer surface of the second medium layer, and the fourth material layer having a higher thermal conductivity than the first medium layer and the second medium layer.

20. The boundary acoustic wave device according to claim 1, further comprising an impedance matching circuit in the interface or on an outer surface of the first or the second medium layer.

21. The boundary acoustic wave device according to claim 1, wherein the second medium layer has a thickness of about $0.5\lambda$ or more and the sound absorbing layer has a thickness of about $1.0\lambda$ or more.

22. The boundary acoustic wave device according to claim 1, wherein the sound absorbing layer has a multilayer structure.

23. The boundary acoustic wave device according to claim 22, wherein the multilayer structure of the sound absorbing layer includes a plurality of sound absorbing material layers, and a sound absorbing material layer closest to the second medium layer has an acoustic characteristic impedance between the acoustic impedances of the second medium layer and a sound absorbing material layer farther away from the second medium layer.

24. The boundary acoustic wave device according to claim 1, further comprising a mounting board bonded by a bump to a mounting surface of the boundary acoustic wave device, the mounting board made of a material harder than the first and second medium layers and the sound absorbing layer.

25. The boundary acoustic wave device according to claim 1, further comprising a stress absorber arranged between the boundary acoustic wave device and the mounting board.

* * * * *